(12) United States Patent
Davis

(10) Patent No.: US 6,279,724 B1
(45) Date of Patent: Aug. 28, 2001

(54) AUTOMATED SEMICONDUCTOR PROCESSING SYSTEM

(75) Inventor: Jeffry A. Davis, Kalispell, MT (US)

(73) Assignee: Semitool Inc., Kalispell, MT (US)

( * ) Notice: Subject to any disclaimer, the term of this patent is extended or adjusted under 35 U.S.C. 154(b) by 0 days.

(21) Appl. No.: 09/274,511

(22) Filed: Mar. 23, 1999

Related U.S. Application Data

(63) Continuation-in-part of application No. 09/112,259, filed on Jul. 8, 1998, which is a continuation-in-part of application No. 08/994,737, filed on Dec. 19, 1997.

(51) Int. Cl.⁷ .................................................. B65G 25/00
(52) U.S. Cl. .................................... 198/465.2; 198/465.3; 414/940
(58) Field of Search ............................. 198/465.1, 465.2, 198/465.3; 414/937, 938, 940

(56) References Cited

U.S. PATENT DOCUMENTS

| | | | |
|---|---|---|---|
| 4,040,533 | * | 8/1977 | DeBoer et al. ............... 198/465.2 |
| 4,466,530 | * | 8/1984 | Stucker ........................... 198/472 |
| 4,506,777 | * | 3/1985 | Kampf et al. ................... 198/341 |
| 4,568,234 | | 2/1986 | Lee et al. . |
| 5,064,337 | | 11/1991 | Asakawa et al. . |
| 5,090,555 | * | 2/1992 | Kura ............................... 198/465.2 |
| 5,131,799 | * | 7/1992 | Nishi et al. ..................... 414/416 |
| 5,203,445 | * | 4/1993 | Shiraiwa ......................... 414/751 |
| 5,215,420 | | 6/1993 | Hughes et al. . |
| 5,232,328 | | 8/1993 | Owczarz et al. . |
| 5,364,219 | | 11/1994 | Takahashi et al. . |
| 5,378,145 | | 1/1995 | Ono et al. . |
| 5,431,421 | | 7/1995 | Thompson et al. . |
| 5,553,988 | * | 9/1996 | Horn et al. ..................... 198/465.1 |
| 5,613,821 | | 3/1997 | Muka et al. . |
| 5,660,517 | | 8/1997 | Thompson et al. . |
| 5,664,337 | | 9/1997 | Davis et al. . |
| 5,674,039 | | 10/1997 | Walker et al. . |
| 5,678,320 | | 10/1997 | Thompson et al. . |
| 5,731,678 | | 3/1998 | Zila et al. . |
| 5,772,386 | | 6/1998 | Mages et al. . |
| 5,784,797 | | 7/1998 | Curtis et al. . |
| 5,885,045 | * | 3/1999 | Rush .................................. 414/417 |

FOREIGN PATENT DOCUMENTS

| | | |
|---|---|---|
| 0 047 132 A2 | 3/1982 | (EP) . |
| 0 452 939 A1 | 10/1991 | (EP) . |
| 0 560 439 A1 | 9/1993 | (EP) . |
| 59-114206 | * 7/1984 | (JP) ................. 198/465.1 |
| 63-219134 | 9/1988 | (JP) . |
| 5-146984 (A) | 6/1993 | (JP) . |
| 158883 | 5/1991 | (TW) . |

OTHER PUBLICATIONS

Brochure—"Magnum—The perfect partnership of process excellence and production control in a fully–automated platform", Semitool, 1996, 12 pages.
Brochure—"Centurium—5000/6000 Series Automated Process Systems for Large Substrate Wet Processing" Semitool, Jun. 1996, 3 pages.
Brochure—"Centurim—Process Cluster" Semitool, Sep. 13, 1995, 16 pages.
Brochure—Centrium Fully Automated Large Substrate Wet Processing System Semitool, 6/96, 5 pages.

\* cited by examiner

Primary Examiner—Thomas J. Brahan
(74) Attorney, Agent, or Firm—Lyon & Lyon LLP

(57) ABSTRACT

An automated semiconductor processing system has an indexer bay perpendicularly aligned with a process bay within a clean air enclosure. An indexer in the indexer bay provides stocking or storage for work in progress semiconductor wafers. Process chambers are located in the process bay. A process robot moves between the indexer bay and process bay to carry semi-conductor wafers to and from the process chambers. The process robot has a robot arm vertically moveable along a lift rail. Semiconductor wafers are carried offset from the robot arm, to better avoid contamination. The automated system is compact and requires less clean room floor space.

25 Claims, 25 Drawing Sheets

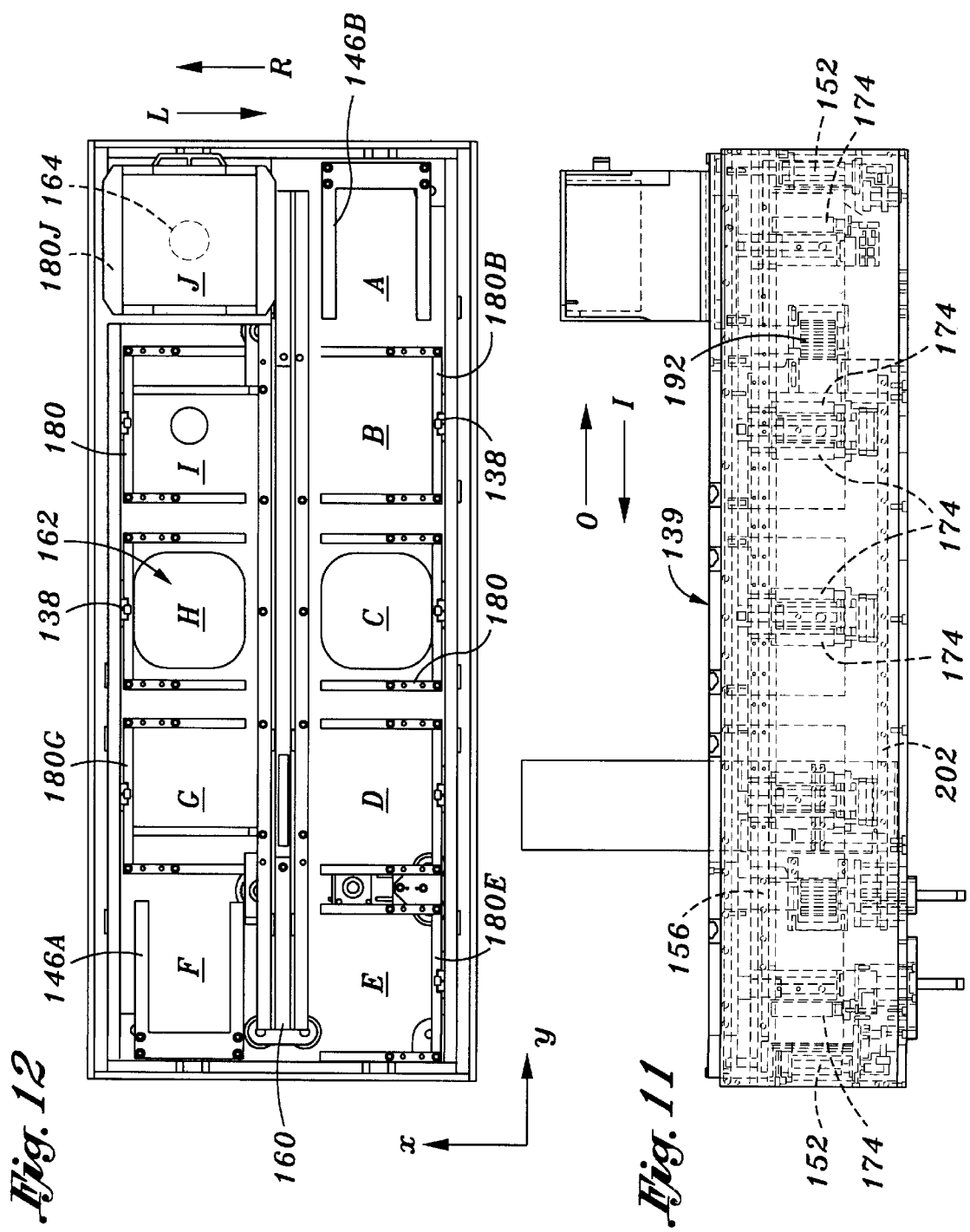

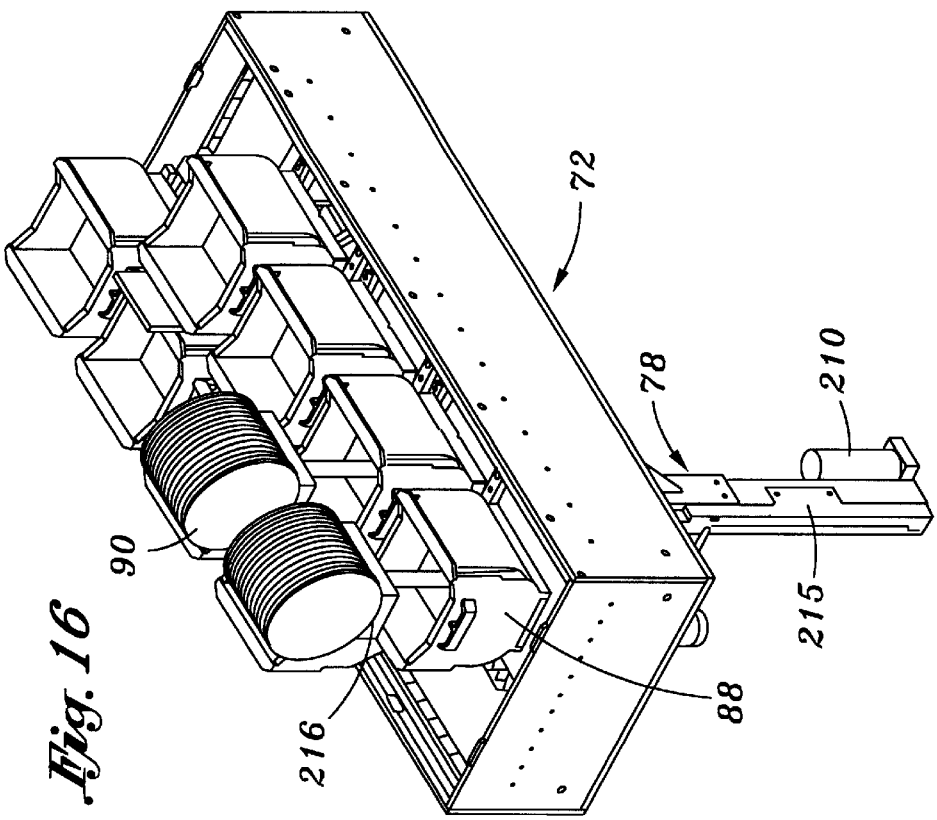
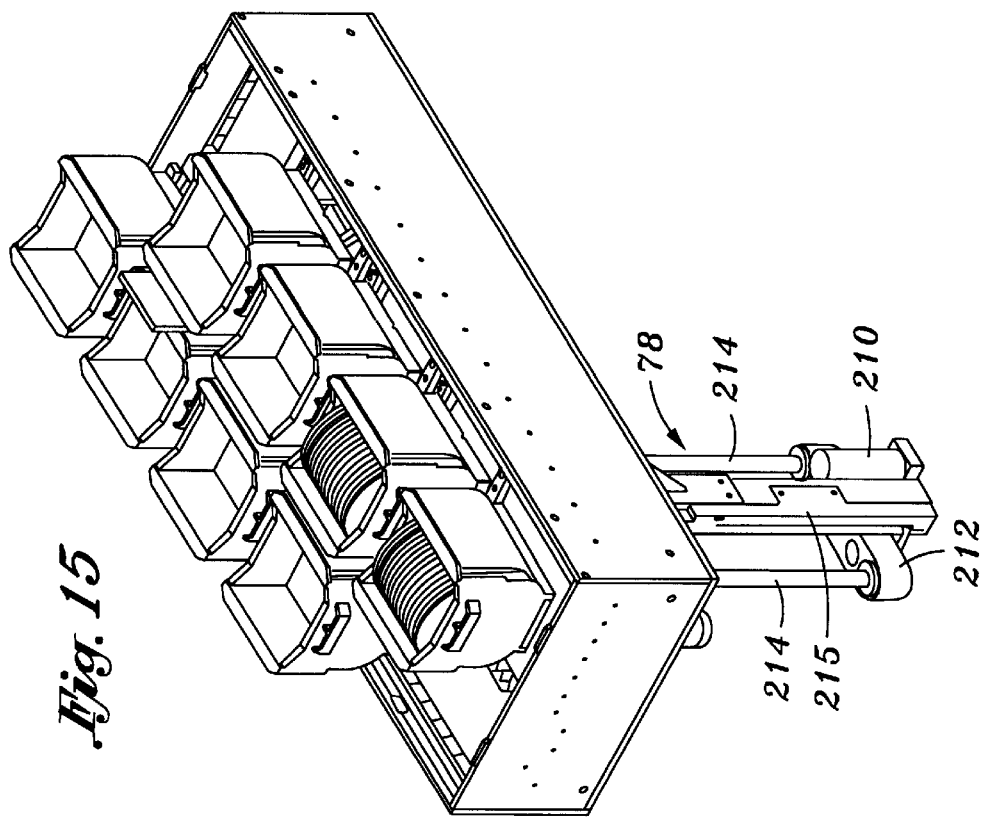

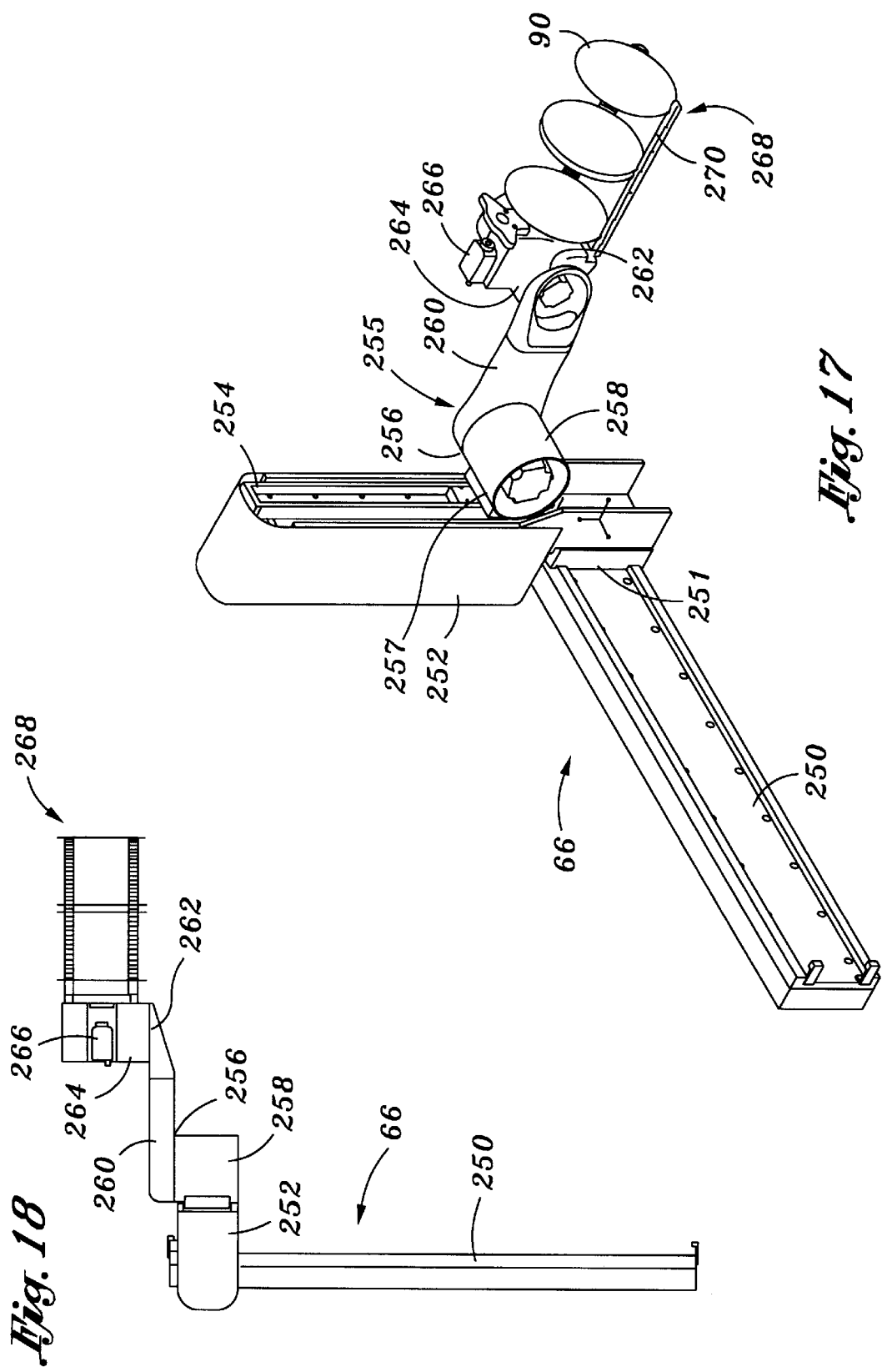

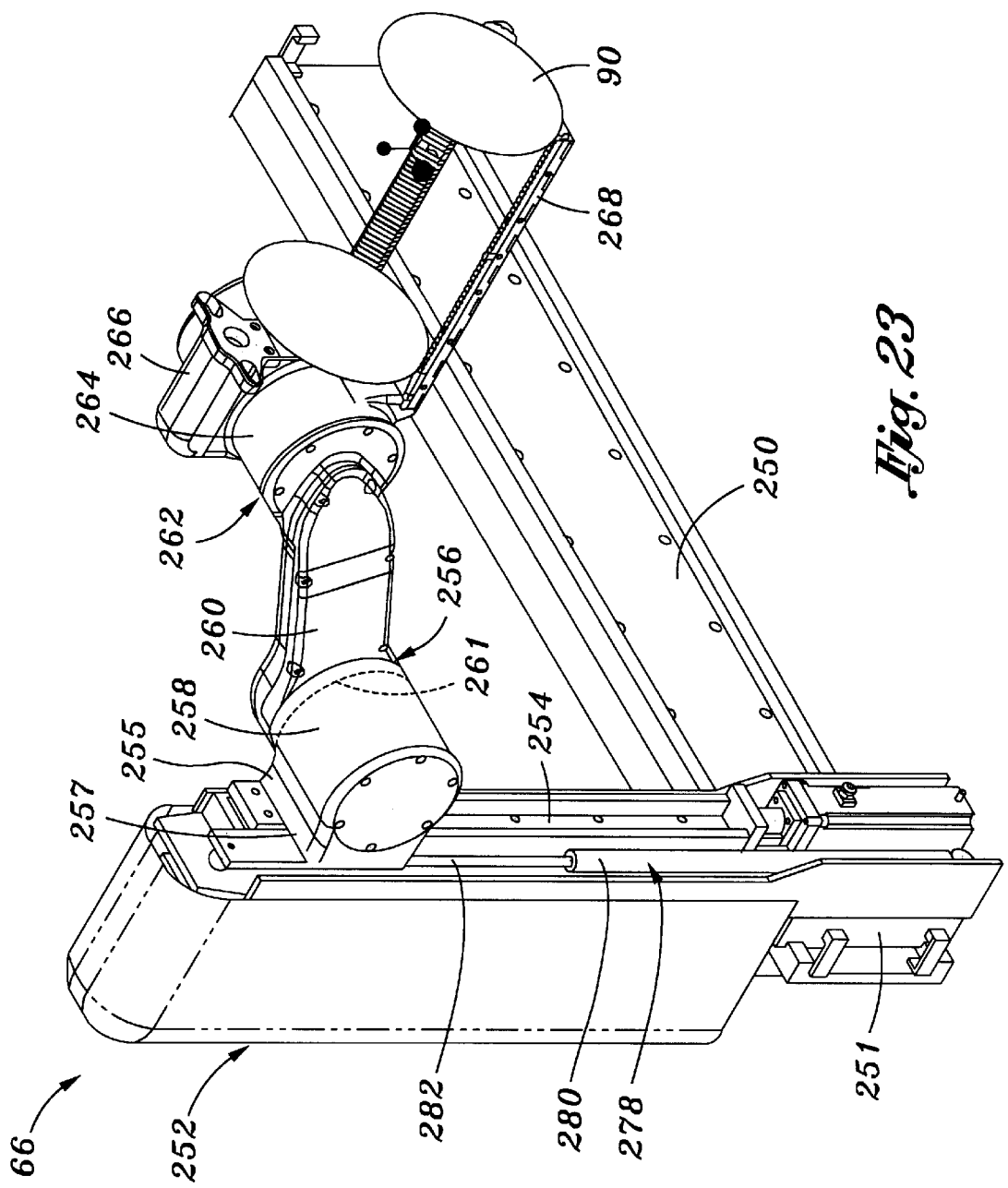

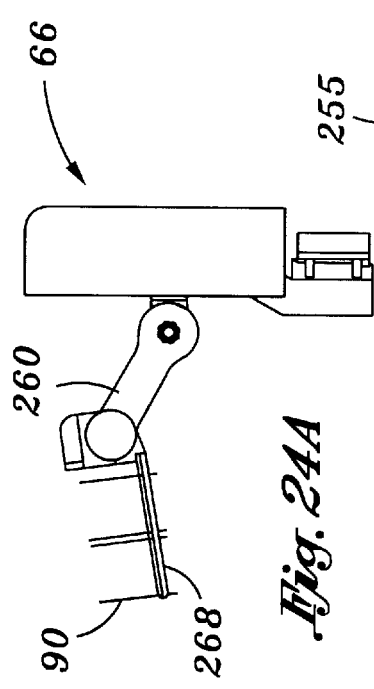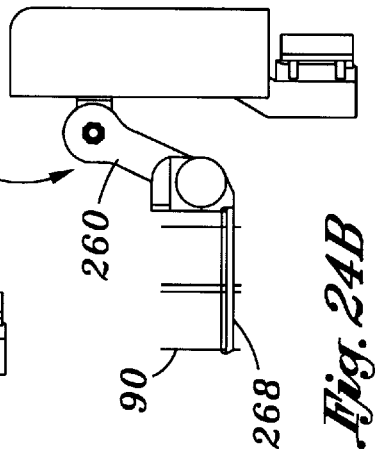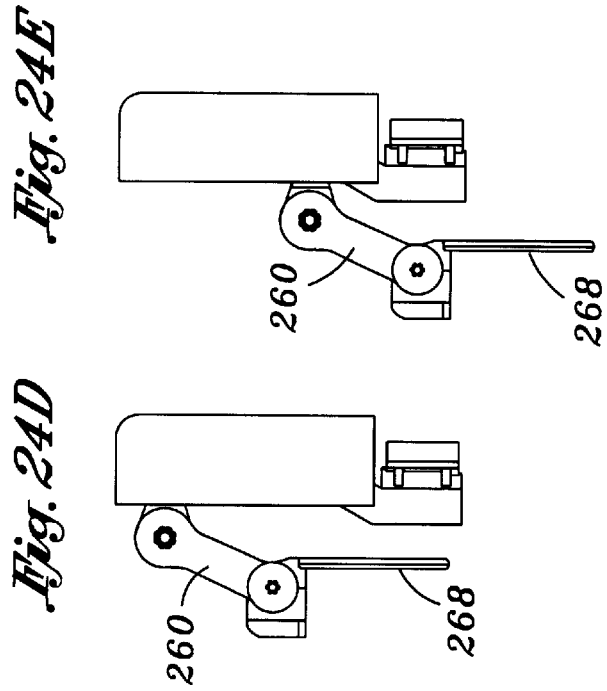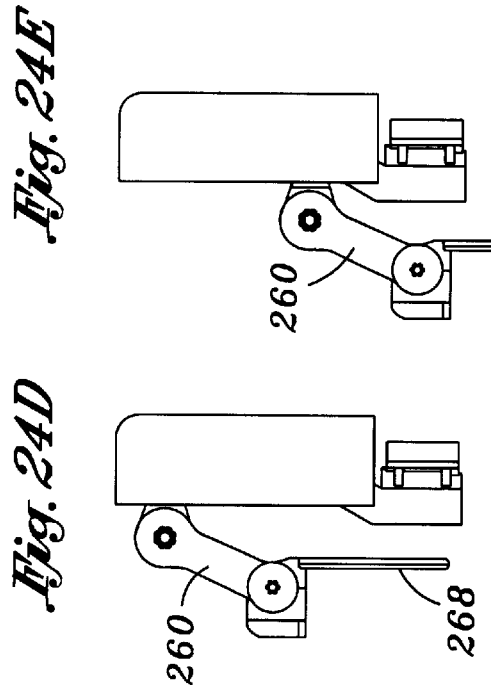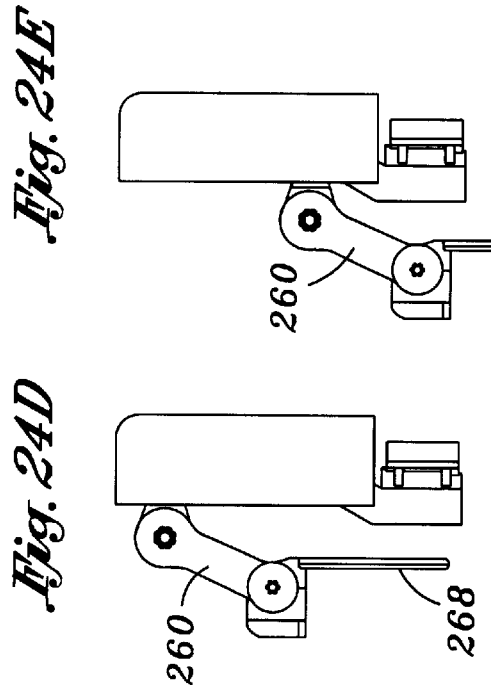

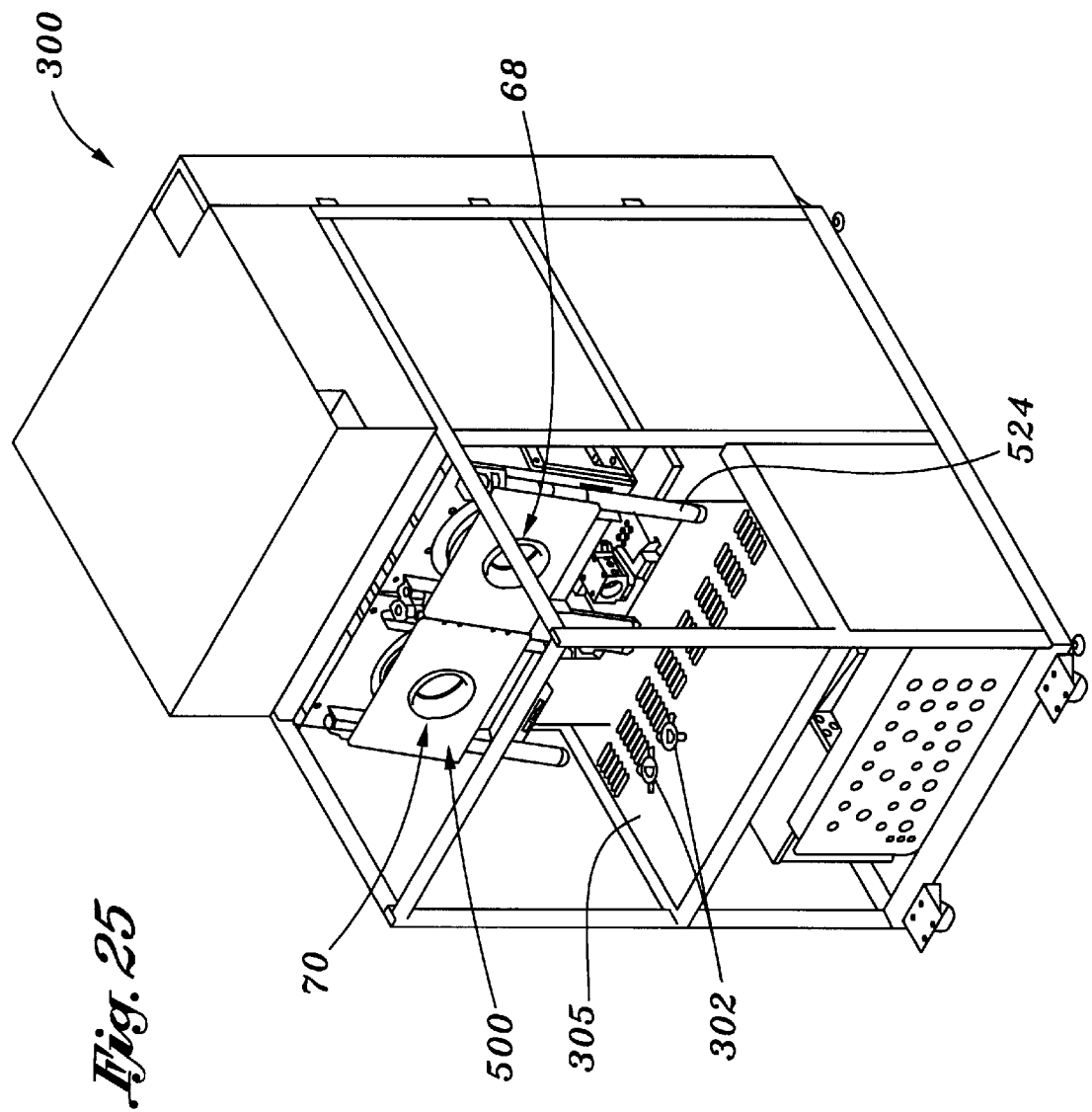

AUTOMATED SEMICONDUCTOR PROCESSING SYSTEM

This application is continuation-in-part of U.S. patent application Ser. No. 09/112,259, filed Jul. 8, 1998, which is a continuation-in-part of U.S. patent application Ser. No. 08/994,737, filed Dec. 19, 1997 and entitled "Semiconductor Wafer Processing Apparatus Having Improved Wafer Input/Output Handling System", Express Mail No. EM425812465US, and incorporated herein by reference.

The field of the invention is automated semiconducted wafer processing systems, used for processing semiconductor wafers, hard disk media, semiconductor substrates, and similar materials requiring very low levels of contamination.

BACKGROUND OF THE INVENTION

Computers, televisions, telephones and other electronic products contain large numbers of essential electronic semiconductor devices. To produce electronic products, hundreds or thousands of semiconductor devices are manufactured in a very small space, using lithography techniques on semiconductor substrates, such as on silicon wafers. Due to the extremely small dimensions involved in manufacturing semiconductor devices, contaminants on the semiconductor substrate material, such as particles of dust, dirt, paint, metal, etc. lead to defects in the end products.

To exclude contaminants, semiconductor substrates are processed within clean rooms. Clean rooms are enclosed areas or rooms within a semiconductor manufacturing facility, designed to keep out contaminants. All air provided to a clean room is typically highly filtered to prevent airborne contaminants from entering into or circulating within the clean room. Special materials and equipment are needed to maintain contaminants within the clean room at adequately low levels. Consequently, construction and maintenance of clean rooms can be time consuming and costly. As a result, the semiconductor processing equipment installed within a clean room should preferably be compact, so that large numbers of semiconductor wafers can be processed within a smaller space, thereby reducing space requirements and costs. Accordingly, there is a need for smaller semiconductor processing equipment, to reduce clean room space requirements.

Existing automated semiconductor processing systems use robots to carry the semiconductor materials. These robots are designed to avoid creating particles which could contaminate the semiconductors. However, even with careful design, material selection, and robot operation, particles may still be created by these robots, via their moving parts. Accordingly, there is a need for improved techniques for processing semiconductor substrate materials with very low levels of contamination to maintain the level of defects at acceptable levels.

SUMMARY OF THE INVENTION

In a first aspect of the invention, an automated semiconductor processing system has an indexer bay or space and a process bay or space within an enclosure. The indexer bay is oriented perpendicularly to the process bay, to form a compact design requiring less floor space in a clean room.

In a second separate aspect of the invention, an indexer is provided in the indexer bay. The indexer preferably holds pallets for supporting semiconductor wafers contained within cassettes. Pallet movers in the indexer move the pallets and cassettes in sequence from an indexer loading position, through a plurality of intermediate storage positions, to an indexer unload position. The indexer allows the automated semiconductor processing system to run continuously, by moving and storing cassettes.

In a third separate aspect of the invention, the pallet movers include an x-axis and y-axis shift system, for moving pallets longitudinally and laterally around in the indexer. Preferably the y-axis shift system has a pair of toothed belts engaging a rack on the bottom of the pallets, to prevent inadvertent movement of the pallets relative to the belts.

In a fourth separate aspect of the invention, prisms on the pallets redirect light beams from sensor pairs, to detect the presence or absence of a cassette on a pallet, or wafers in a cassette.

In a fifth separate aspect of the invention, a process robot within an automated semiconductor processing system has a robot arm vertically moveable along a lift rail. The robot arm has a forearm segment extending between an elbow joint and a wrist joint. A wafer holder on the robot arm is laterally offset from the elbow and wrist joints. The robot arm is compact yet has an extended range of travel. The processing system therefore requires less space.

In a sixth and separate aspect of the invention, a moveable buffer shelf is positioned over the indexer, to increase productivity and versatility of the system.

In a seventh and separate aspect of the invention, a novel process module door is provided to better close and seal a process module chamber.

In a eighth aspect of the invention, two or more of the features described above are combined to provide an improved automated semiconductor processing system.

It is an object of the invention to provide an automated semiconductor processing system, better designed to keep semiconductor wafers free of contaminants. It is a further object of the invention to provide an automated semiconductor processing system that is versatile, yet compact, to reduce clean room space requirements.

Other objects, features and advantages will appear hereinafter.

BRIEF DESCRIPTION OF THE DRAWINGS

In the drawings, wherein the same reference number denotes the same element throughout the several views:

FIG. 11 is a leftside view of the indexer shown in FIGS. 1–3;

FIG. 12 is a plan view thereof, with the pallets on the indexer removed, for clarity of illustration;

FIG. 15 is a perspective view of the elevator shown in FIG. 5, in the lowered position;

FIG. 16 is a perspective view thereof showing the elevator in the raised position;

FIG. 17 is a front perspective view of the process robot shown in FIGS. 2 and 5;

FIG. 18 is a plan view thereof;

FIG. 23 is a front perspective view of the process robot;

FIGS. 24A–24E are schematic illustrations showing various positions of the arm of the process robot;

FIG. 25 is a perspective view of a process module, as shown in FIGS. 3–5;

DETAILED OF DESCRIPTION OF THE DRAWINGS

OVERVIEW

Figure 1:
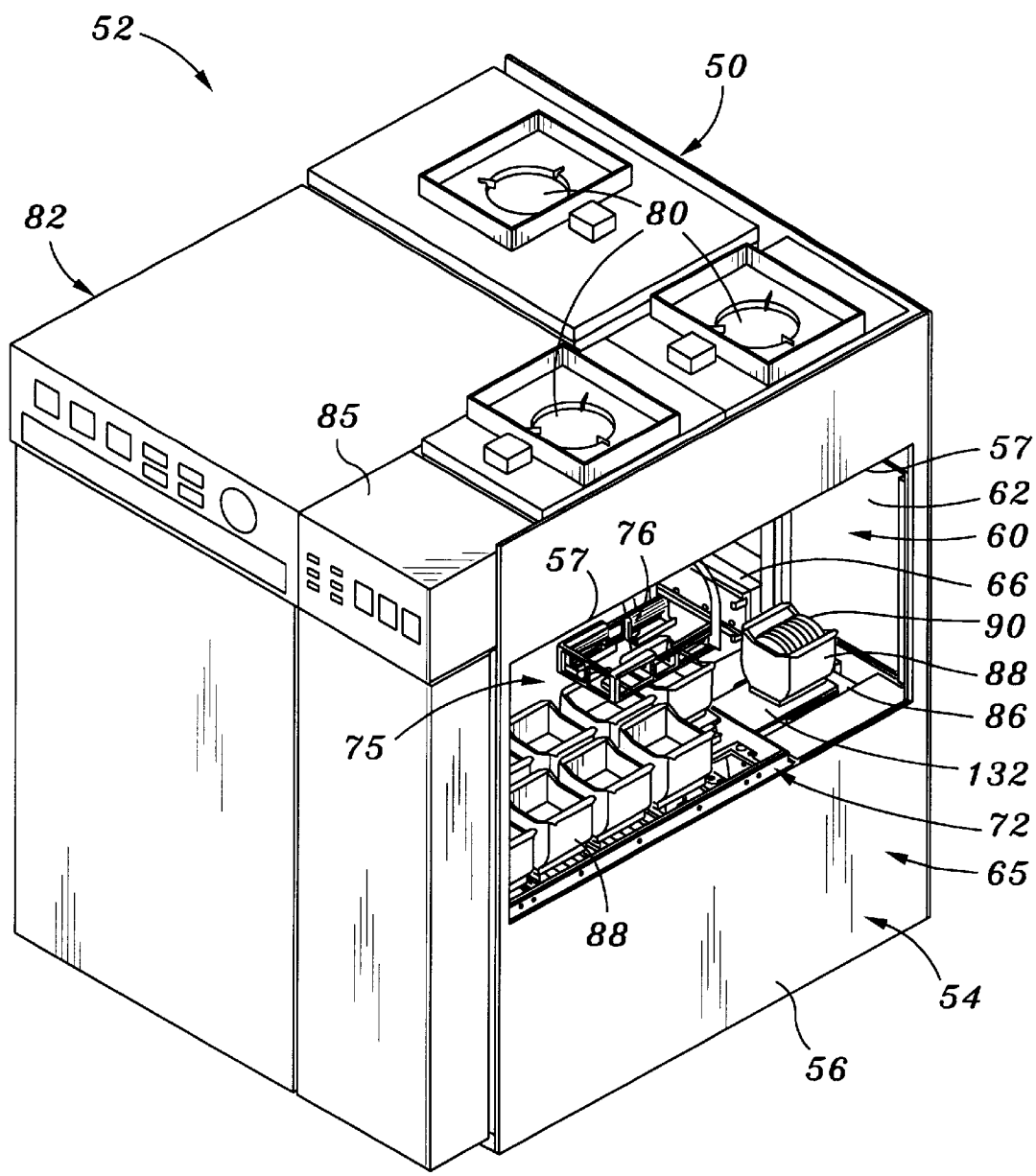
FIG. 1 is a top, rear and left side perspective view of the present automated semiconductor processing system.
Figure 2:
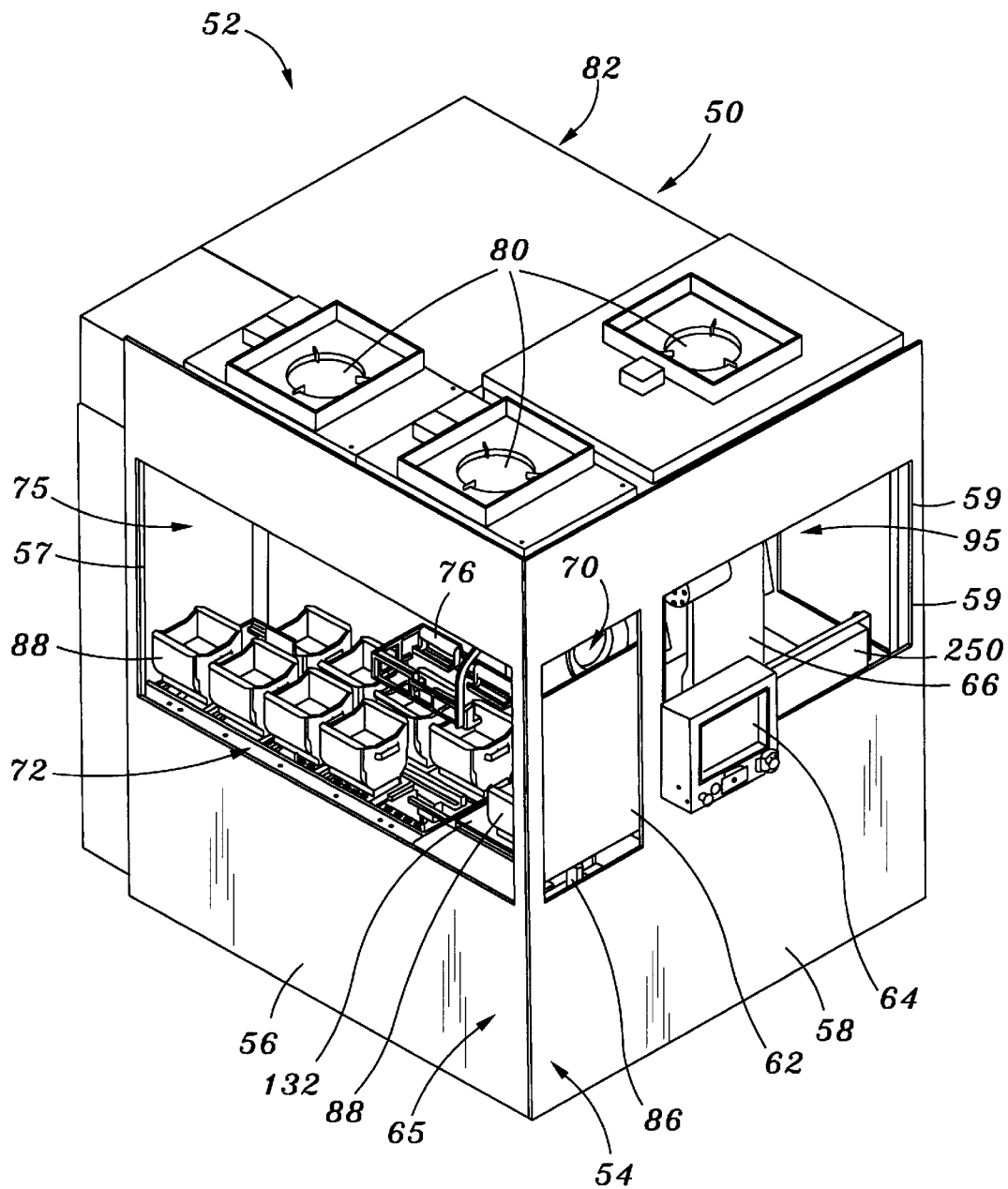
FIGS. 2 and 3 are front, top, and left side perspective views thereof.

Turning now in detail to the drawings, as shown in FIGS. 1–5, an automated semiconductor material processing system 50 is installed within a clean room 52. The system 50 has a clean air enclosure or housing 54 having a left side wall 56 with a fixed transparent window 57 to allow viewing of operations within the enclosure 54. Similarly, the enclosure 54 has a front wall 58, as shown in FIG. 2, having a fixed transparent window 59.

A loading/unloading opening 60 in the front wall 58 is closed off during operation of the system 50 by a transparent loading window or panel 62, as illustrated in FIG. 2. Referring to FIGS. 1–5, down draft fans or blowers 80 are provided on top of the enclosure 54, to continuously move clean air room downwardly through the enclosure. A utilities compartment 82 provides space for power supplies, reagent tanks, pumps, and other components well known for semiconductor processing.

A user interface 64, on the front wall 58 provides information and inputs control instructions from the system operator. The user interface is linked to a computer/controller 85, in the utilities compartment 82, or at a remote location. The computer/controller 85 is linked to the various motors and sensors described below, as well as to a facility control computer, to control operation of the system 50.

Figure 3:
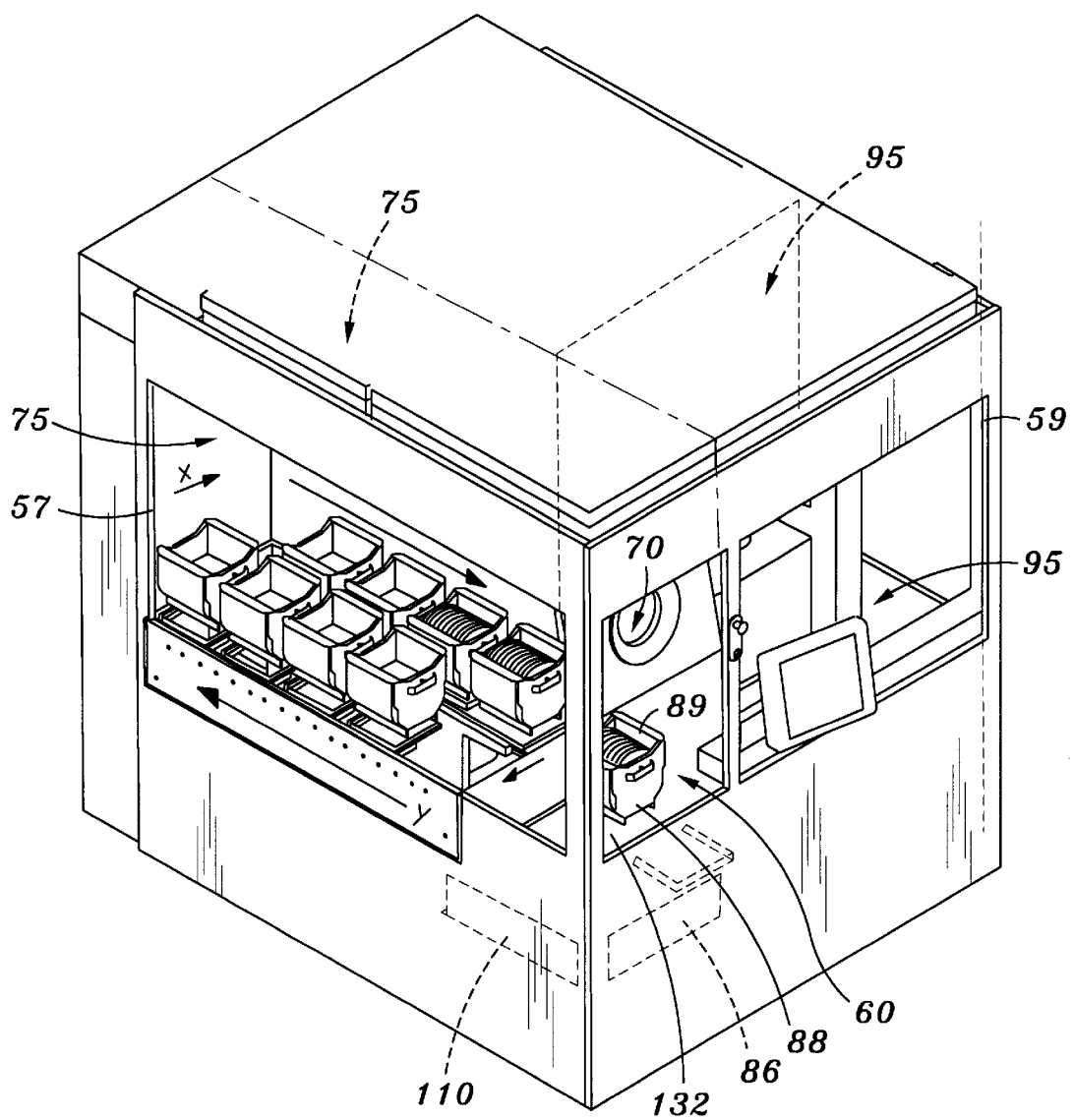

Referring to FIGS. 1–4, and especially to FIG. 3, the system 50 includes an indexer bay or space 75 extending rearwardly along the left side wall 56. A process bay or space 94 extends along the front wall 58, perpendicularly to the indexer bay 75. The indexer bay or space 75, and a process bay or space 95 are continuous with each other, and are designated and illustrated schematically in FIG. 3, as separate spaces only for purposes of description. Referring to FIGS. 1–5, the loading/unloading window 60 opens through the front wall 58 of the enclosure 54 into the indexer bay 75. An I/O robot 86 in the indexer bay 75 is located largely below the opening 60.

An indexer 72 is provided in the indexer bay 75, generally in alignment with the opening 60. An input plate 132 on the indexer 72 extends over the I/O robot 86 toward the window 60. The indexer 72 preferably holds up to eight cassettes 88 containing flat media, e.g., silicon wafers 90. The cassettes 88 rest on pallets 136 on the indexer 72. The pallets 136 and the I/O plate 132 are vertically positioned at about the same elevation as the bottom of the opening 60. A moving buffer shelf 76 is supported above the cassettes 88 on the indexer 72 via a vertical buffer plate 130 extending up from a center beam in the indexer 72.

Figure 4:
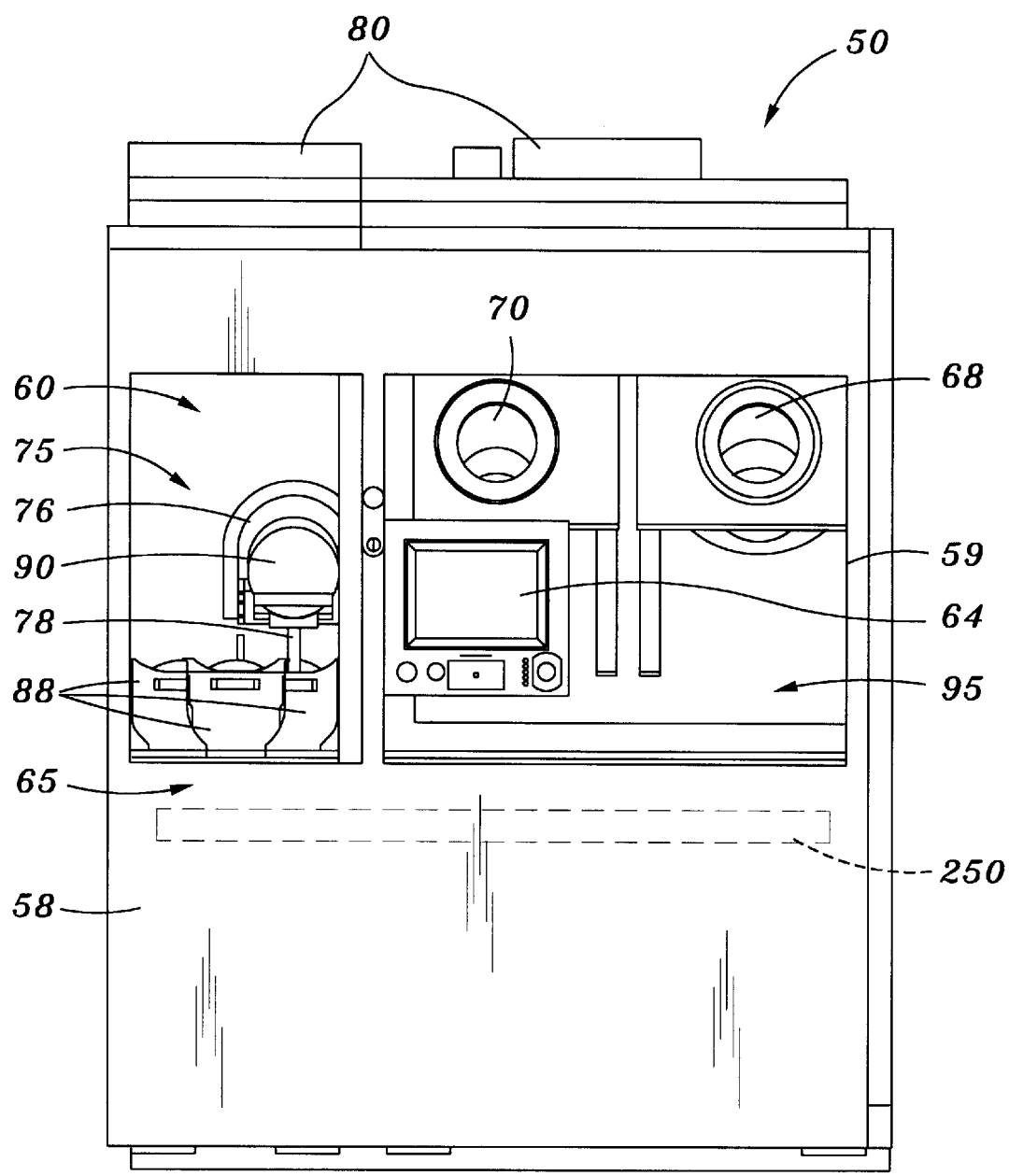
FIG. 4 is a front elevation view thereof.

Referring to FIGS. 2, 3 and 4, the process bay 95 includes two or more process chambers. In the embodiment shown, the process chambers are a chemical process chamber 68, and a spin/rinser dryer 70. A process robot 66 moves through the process bay 95 to the indexer 72, to carry wafers 90 to or from the chambers 68 or 70.

Figure 5:
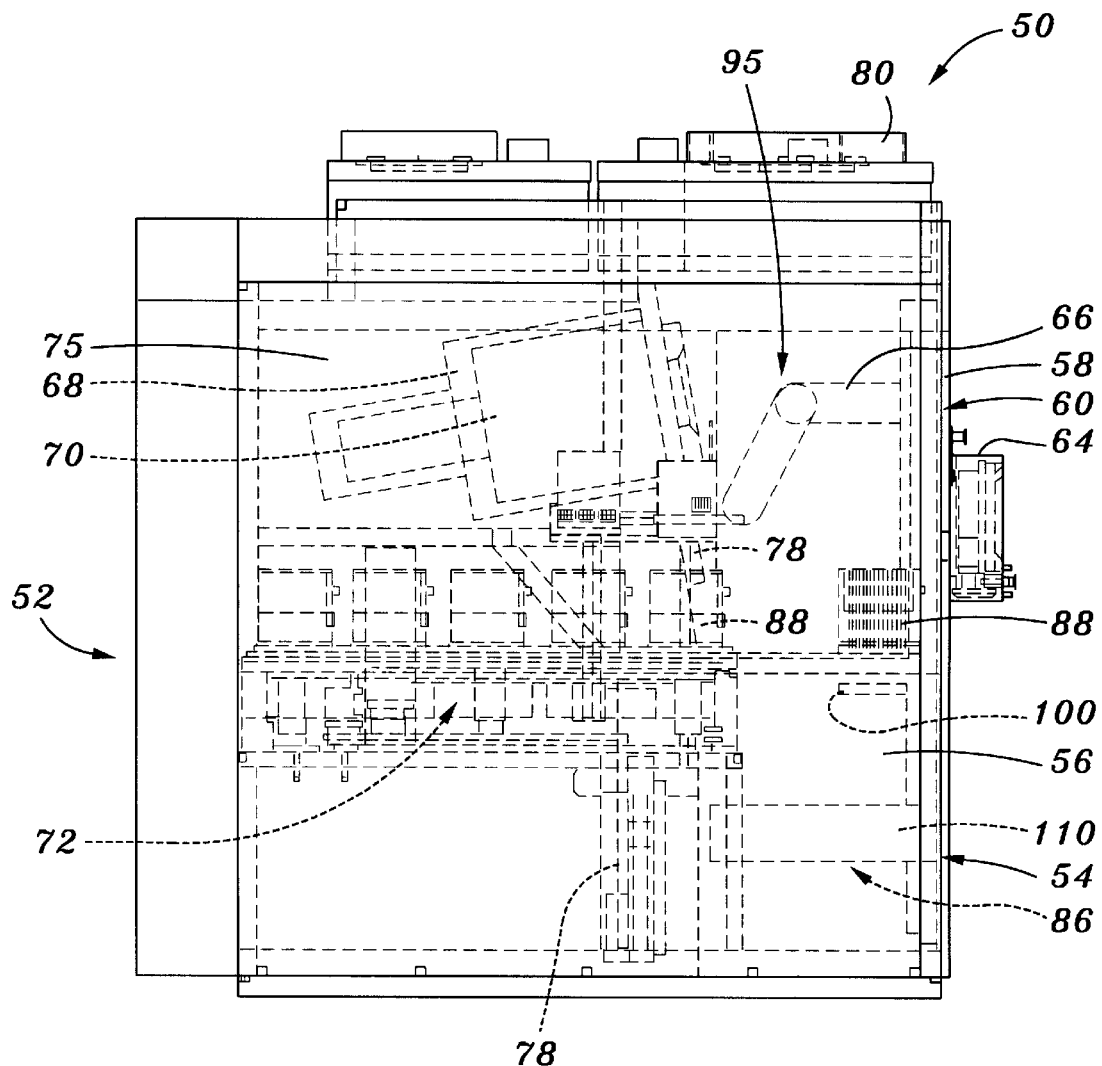
FIG. 5 is a left side view thereof.

Referring to FIGS. 3 and 5, and momentarily to FIGS. 15 and 16, an elevator 78 under the indexer 72 lifts the wafers 90 out of the cassettes 88 (2 cassette loads at a time) so that they can be picked up and carried by the process robot 66. As shown in FIG. 16, each cassette 88 preferably holds 25 wafers, with the eight cassette capacity of the indexer 72 holding 200 wafers. The wafers are handled in batches of 50, as the elevator 78 and process robot 66 carry the combined contents of two cassettes simultaneously.

THE I/O ROBOT

Figure 6:
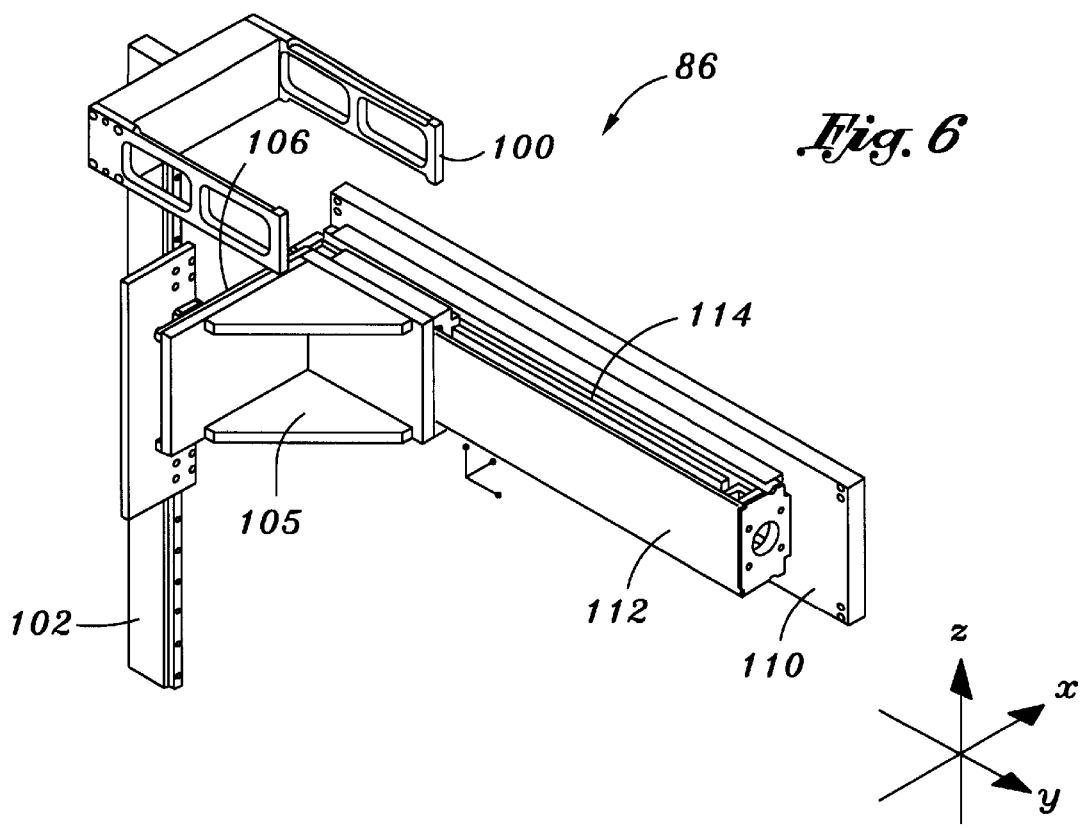
FIG. 6 is a front perspective view of the input/output robot shown in FIG. 3.
Figure 7:
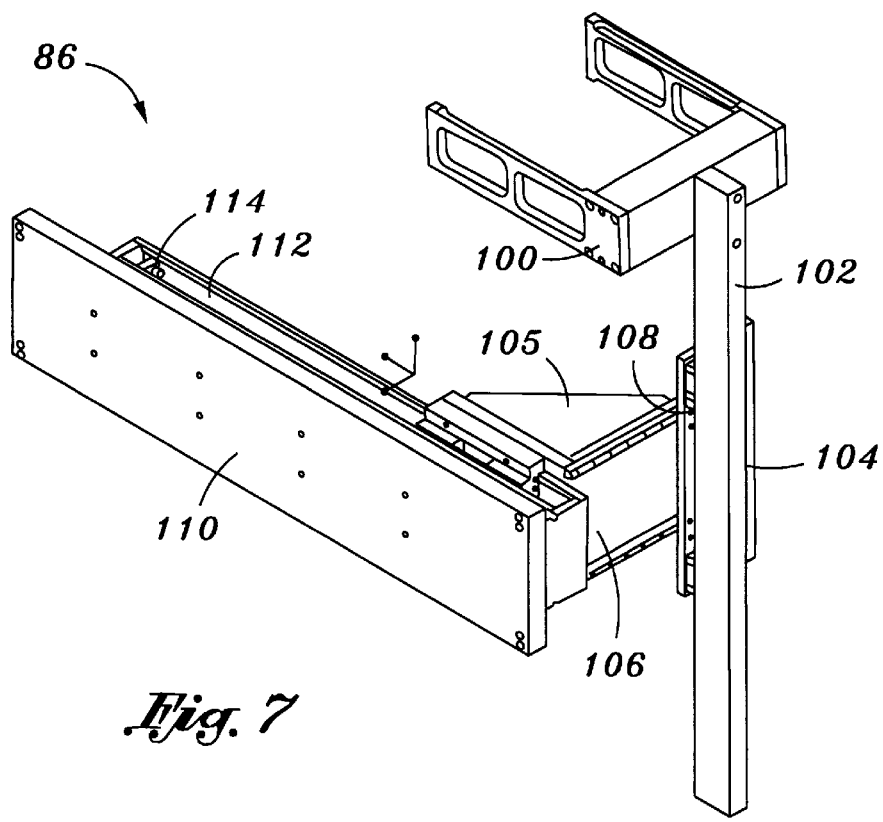
FIG. 7 is a rear perspective view thereof.

Referring to FIGS. 6 and 7, the I/O robot 86 has a mounting plate 110 attached to the left side wall 56 or adjacent enclosure structure. A Y-axis rail 112 is supported on the mounting plate 110. A linear actuator 114 on the rail 112 moves an armature 105 in the Y direction, as shown in FIGS. 3 and 6.

Referring to FIG. 7, an X-axis rail 106 on the back of the armature 105 supports a Z-axis or vertical fork rail 102. A vertical fork actuator 104 moves the rail 102 vertically on the armature 105. An x-axis actuator 108 moves the vertical rail 102, along with the vertical actuator 104, in the X or lateral direction. A cassette fork 100 near the top of the vertical rail 102 is adapted to lift a cassette 88 by engaging the cassette side flanges 89.

THE INDEXER

Figure 8:
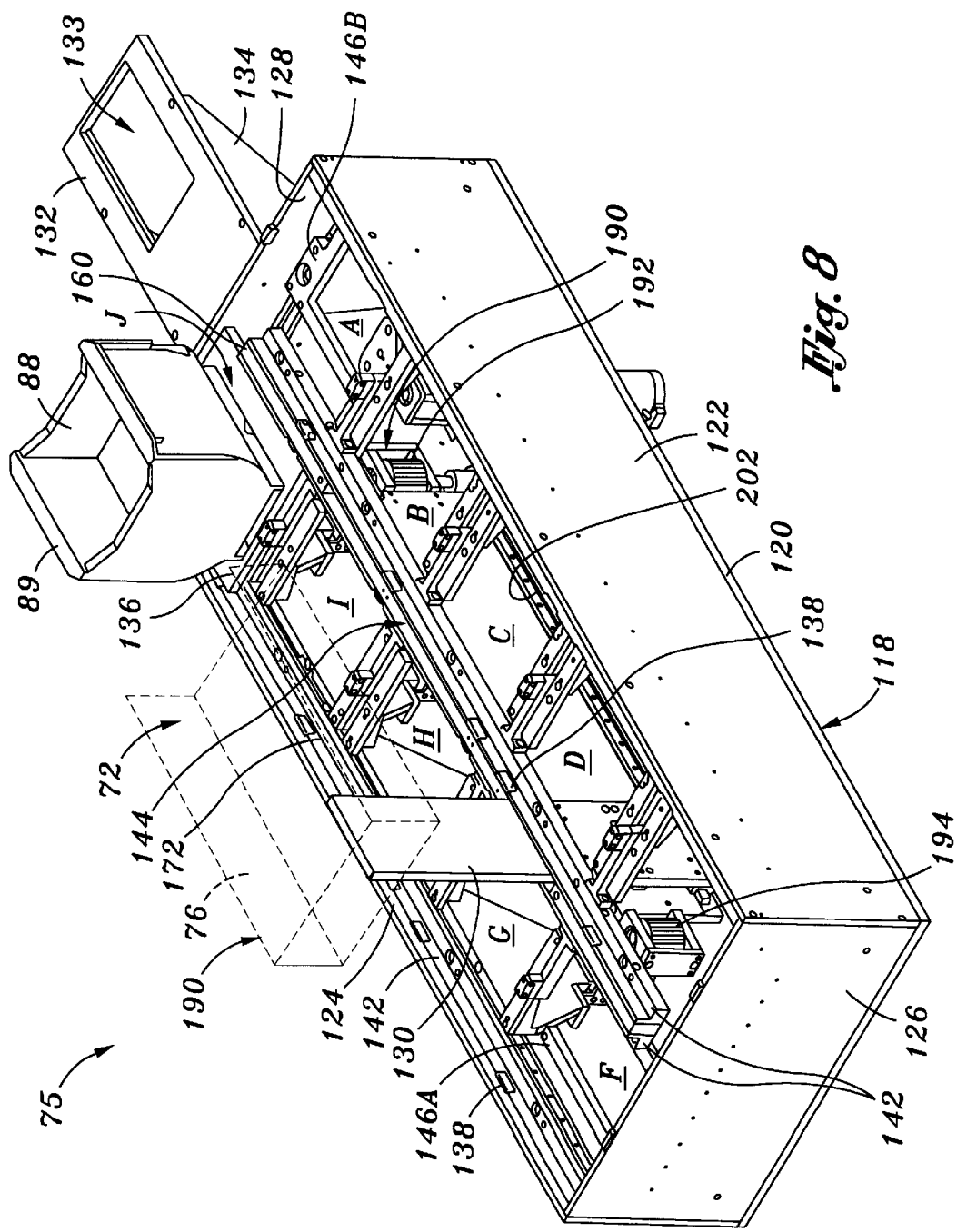
FIG. 8 is a perspective view of the indexer shown in FIGS. 1–3, with various components removed for clarity of illustration.

Turning now to FIG. 8, the indexer 72 has a rectangular frame 118 including a bottom plate 120, a front plate 122, a back plate 124, and left and right end plates 126 and 128. The I/O plate 132 is attached to the right end plate 122, and braced by gussets 134. A center beam 160 divides the indexer into an input row or side 135 and an output row 137. The vertical buffer support plate 130 is positioned and moves back and forth within a centrally located buffer plate slot 144 in the center beam 160. Two pairs of opposing pallet rails 142 extend substantially from the left end plate 126, to the right end plate 128, and provide resting or supporting surfaces for the pallets 136 at the pallet deck or surface 139.

Figure 14:
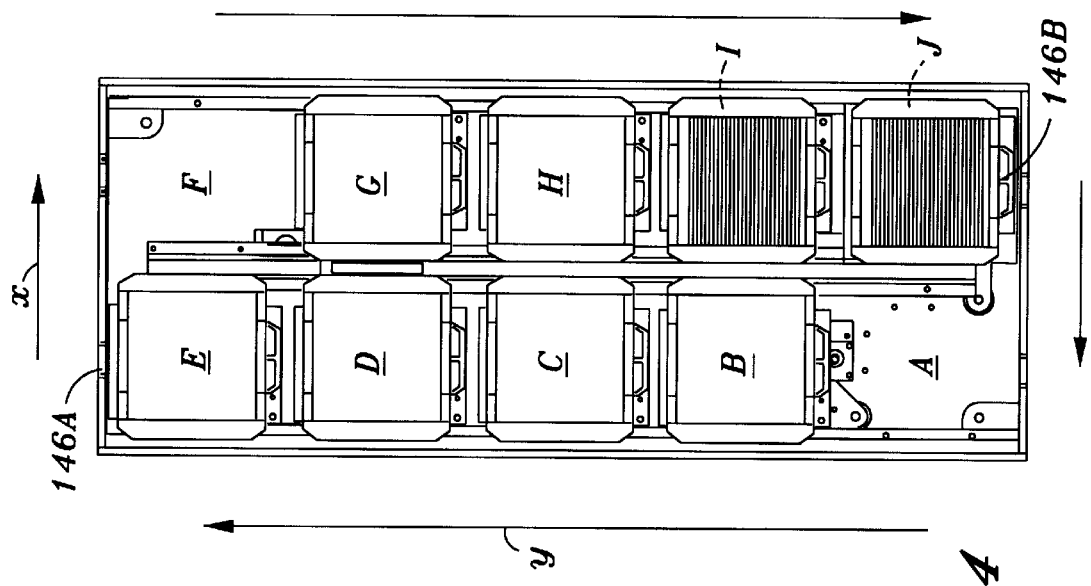
FIG. 14 is a plan view of the indexer shown in FIGS. 1–3, and illustrating sequences of movement.
Figure 13:
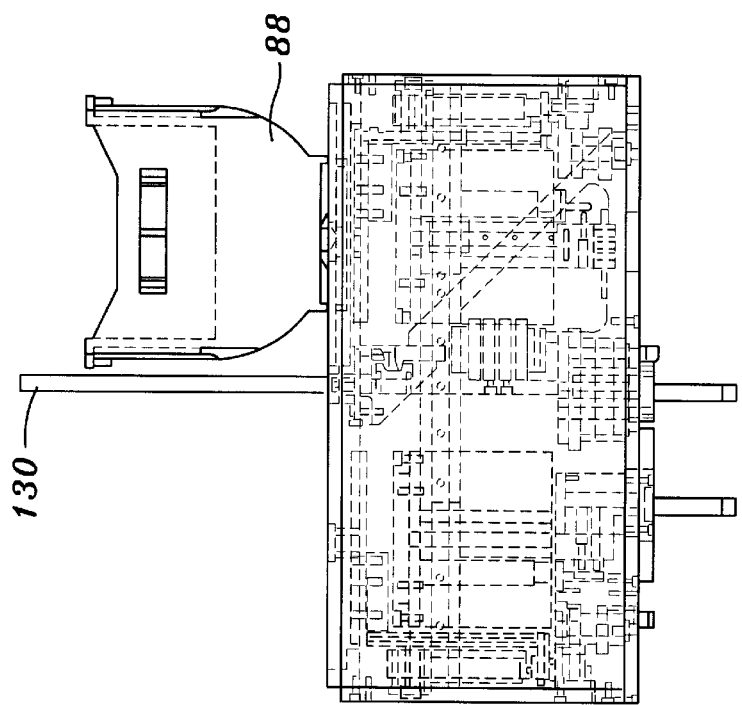
FIG. 13 is a front view of the indexer shown in FIGS. 1–3.
Figure 19:
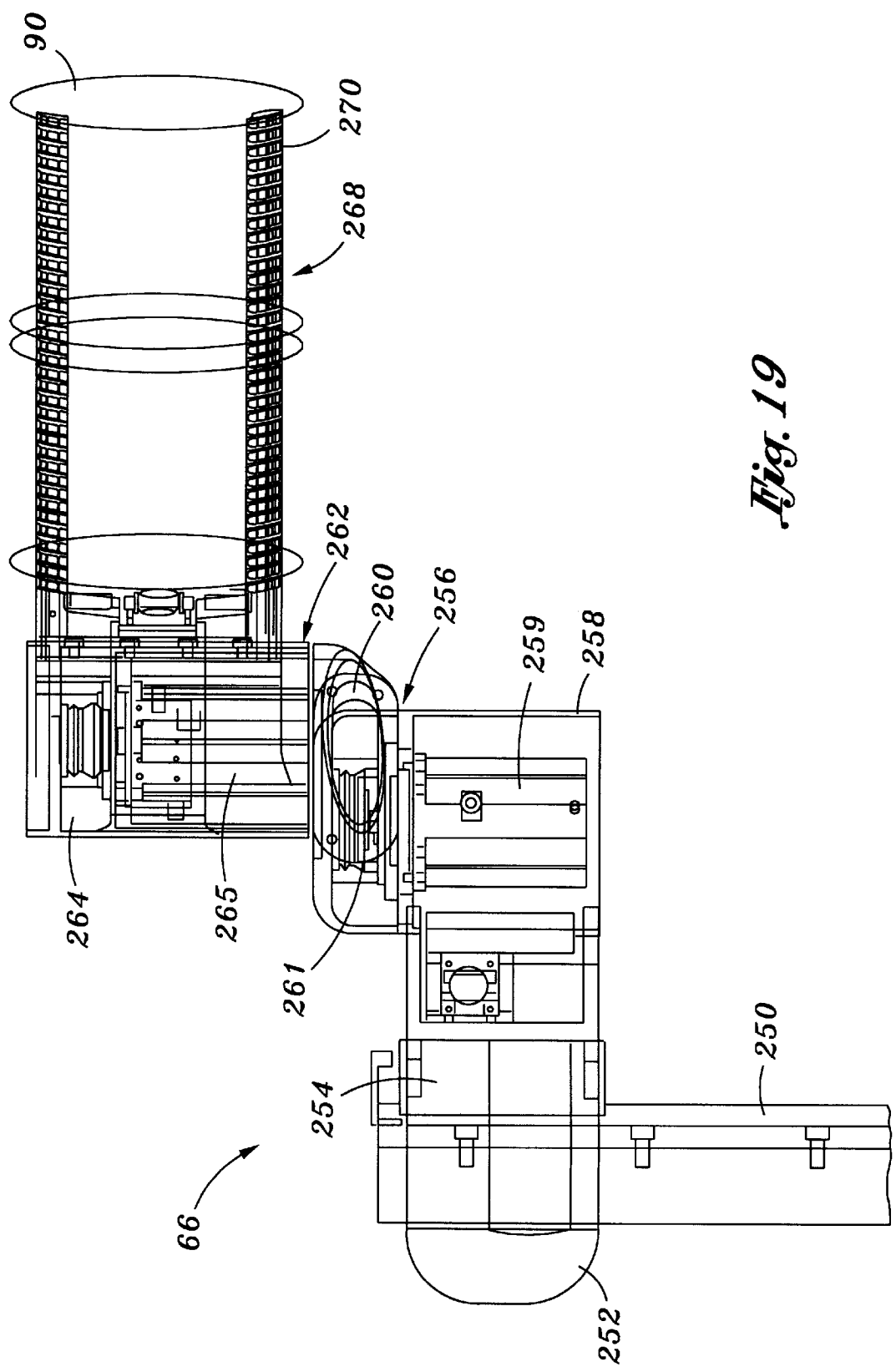
FIG. 19 is an enlarged plan view thereof.

Referring momentarily to FIG. 14, the indexer 72 includes 10 pallet positions: A, B, C, D, E, F, G, H, I, and J. The indexer 72 has eight pallets 136, so that two positions, at diagonally opposite corners, are always vacant. Turning to FIG. 12, cutouts 162 in the bottom plate 120 of the indexer 72, at positions C and H, allow air to flow downwardly through the indexer 72. Elevator clearance holes 164 through the bottom plate 120, at positions I and J, provide clearance for the elevator 78.

Referring still to FIGS. 8–14, the indexer 72 includes a X-axis or lateral shift system or assembly generally designated 140, and a longitudinal or a Y-axis shift system or assembly, generally designated 170. These shift systems move the pallets 136 carrying the cassettes 88 around on the indexer 72, as shown in FIG. 14.

Figure 9:
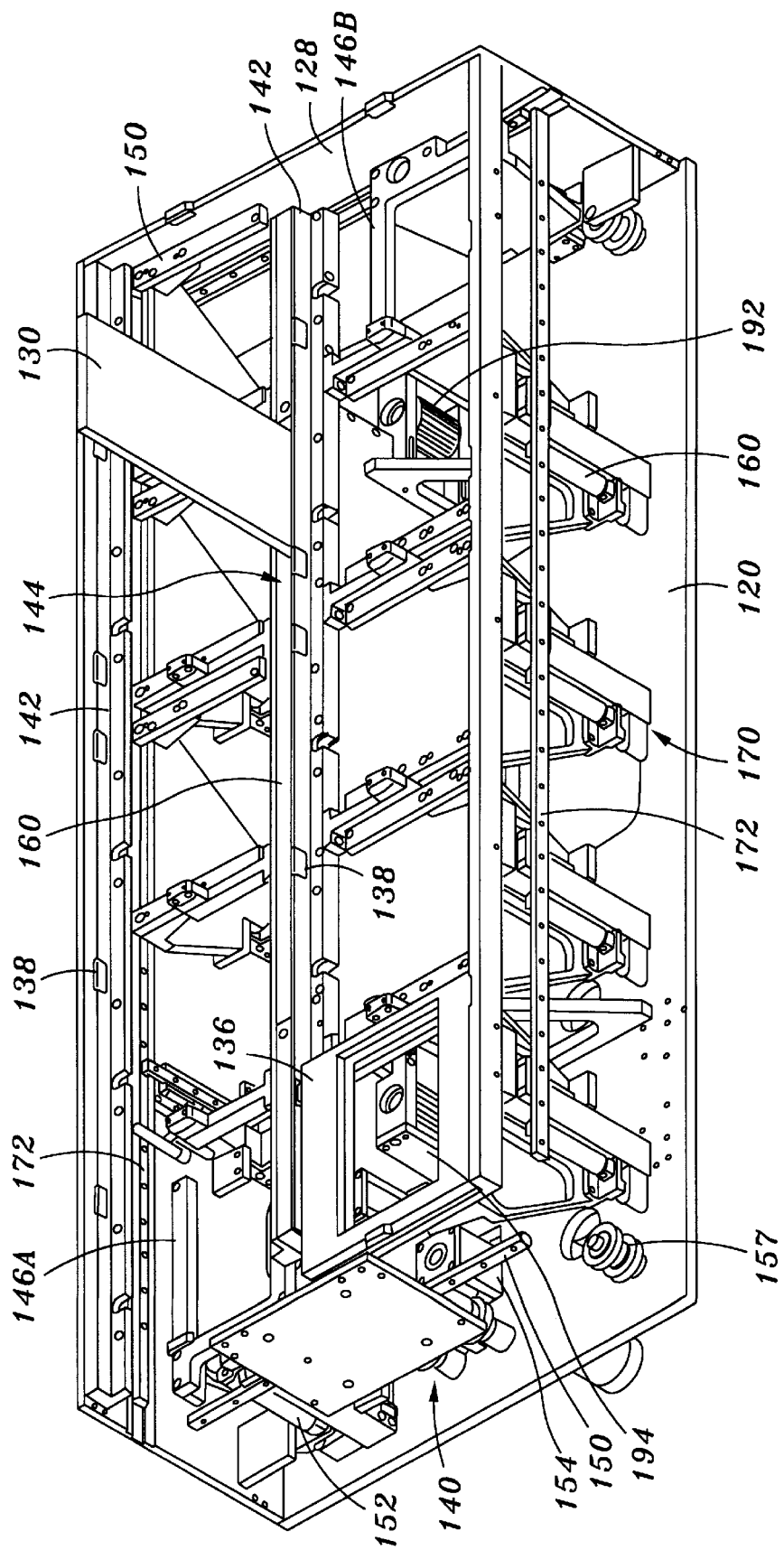
FIG. 9 is a perspective view thereof with additional components removed for clarity of illustration.
Figure 10:
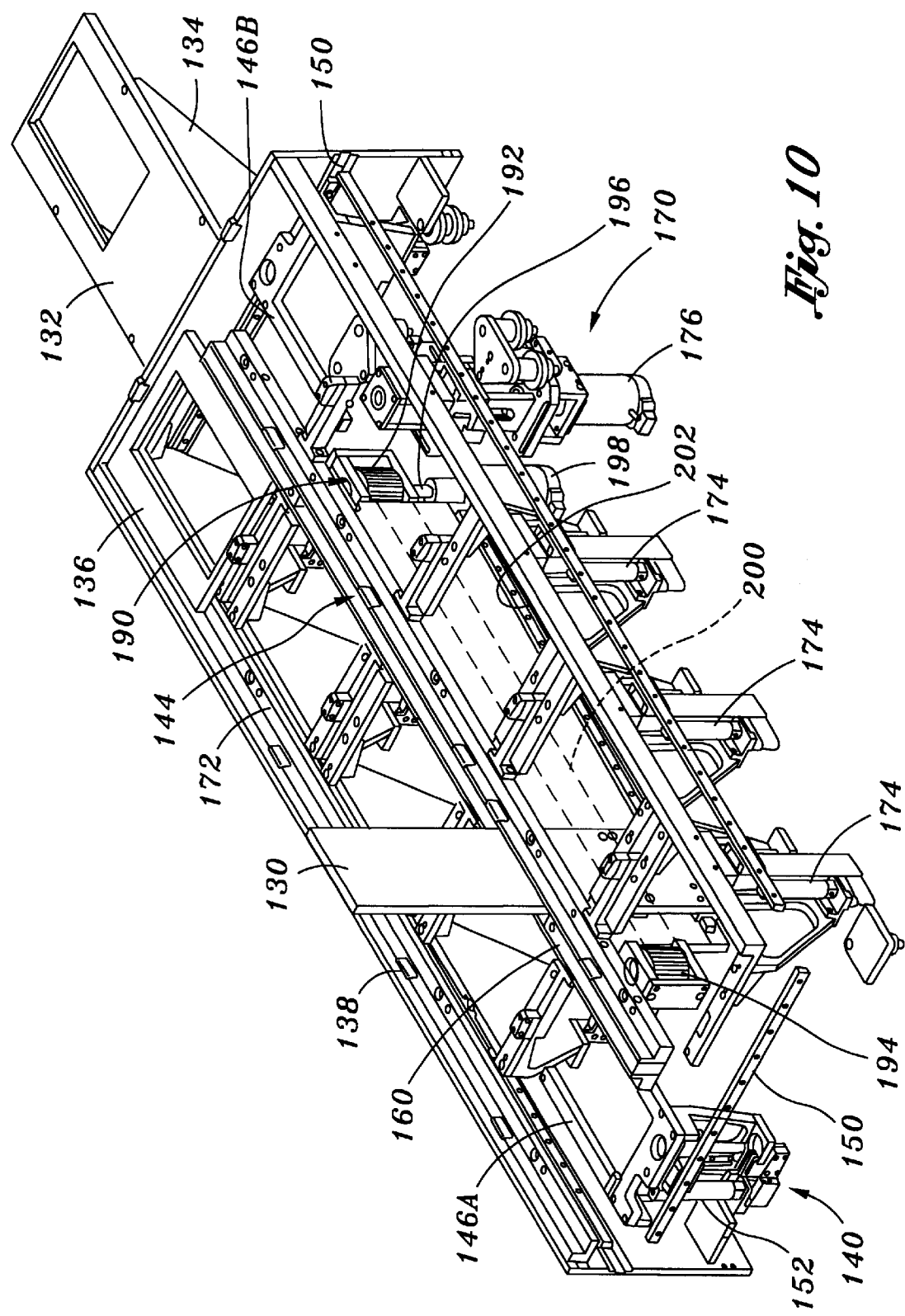
FIG. 10 is yet another perspective view thereof showing additional details.

As best shown in FIG. 9, the lateral shift system 140 includes a lateral guide block 150, fixed to the indexer frame 118. A lateral shift end fork 146A is supported on the lateral guide block 150, and is driven by a lateral drive motor 154 to step or sequence between positions E and F, as shown in FIG. 14. An end fork air cylinder 152 raises and lowers the end fork 146A between fixed up and down positions which are fixed by mechanical stops. FIGS. 9 and 10 show components of the lateral shift system 140 at the left or inside end of the indexer 72. Similar or duplicate components (the lateral guide block 150; an end fork 146B and a lateral air cylinder 152) are mounted at the right end as well. A lateral shift system linking belt 156 extends around the perimeter of the indexer frame 118, supported by idlers 157, and is attached to the diagonally opposite end forks 146A and 146B. When the lateral drive motor 154 is energized, end fork 146A moves from position F to position E, while end fork 146B simultaneously moves from position A to Position J, and vice versa.

Referring still to FIGS. 8–14, the longitudinal or Y-axis shift assembly 170 of the indexer 72 includes longitudinal guide rails 172 extending parallel to the front and back plates 122 and 124, on either side of the center rail 160. Eight side forks 180B–180J are located at positions B, C, D, E, G, H, I, and J, as best shown in FIG. 12. A side fork actuator or air cylinder 174 is attached to each of the eight side forks 180. The air cylinders 174 are longitudinally displaceable with the side forks 180, as they move back and forth on the longitudinal guide rails 172. The eight side forks 180 are joined together by a longitudinal drive belt 178. The longitudinal drive belt 178 extends in a loop around the perimeter of the indexer frame 118, supported on idlers. The longitudinal drive belt 178 is positioned within the indexer frame 118 vertically above the lateral drive belt 156. A longitudinal or Y-axis drive motor 176 is engaged to the drive belt 178, such that with actuation of the motor 176, all eight side forks 180 move simultaneously. Referring to FIG. 12, when the motor drives side forks 180B–180E in the input row 135 in direction I, the side forks 180G–180J on the opposite side of the center beam 160B, in the output row 137, move in direction O.

Referring to FIGS. 8–11, the indexer 72 also includes a buffer shelf shift system or assembly, generally designated 190. The buffer shift system 190 shifts the vertical buffer plate 130, which supports the buffer shelf 76 from the front position shown in FIG. 9 to the rear position shown in FIG. 8. The buffer shelf 76, shown in phantom in FIG. 8 is omitted from the other figures, for clarity of illustration.

Referring primarily to FIG. 10, the buffer shift system 190 includes a buffer drive motor 198 linked to a buffer drive belt 200 through a flex coupling 196, and a buffer capstan 192.

The buffer drive belt 200 extends around the capstan 192 and a buffer belt idler 194, positioned at opposite ends of the buffer plate slot 144. The vertical buffer plate 130 is secured to the buffer drive belt 200. The bottom end of the vertical buffer plate 130 is slidably attached to a buffer plate guide rail 202 underneath the buffer plate slot 144.

The indexer 72 has three sets of sensors 138 at each location A–J. The three sensors at each location may be separate individual sensors, or a single combination sensor. The sensors, at each position, sense whether a pallet is present; whether a cassette is present on a pallet; and whether wafers are present in a cassette. The sensors are linked to a controller or computer and provide status information for each location in the indexer 72. Preferably, optical sensors are used.

Turning now to FIGS. 15 and 16, the elevator 78 has a motor 210 linked to an armature 212 through a lead screw or other rotation to linear drive. Wafer platforms 216 are supported on lift columns 214. Actuation of the motor 210 lifts the armature 212 up along a elevator rail 215, to vertically move the wafers 90 into and out of the cassettes 88. With the wafers 90 lifted out of the cassettes 88 as shown in FIG. 16, they can be picked up by the process robot 66.

THE PROCESS ROBOT

Turning now to FIGS. 17–23, the process robot 66 includes a lateral or X-axis rail 250 extending through the process bay 95 and partially into the indexer bay 75. A lift unit 252 is moveable along the lateral rail 250, driven by a magnetic flux linear drive motor 251. A robot arm, 255, is attached to a vertical lift rail 254 on the lift unit 252. An A/C lift motor 257 moves the robot arm 255 vertically along the lift rail 254. As shown in FIG. 23, the cylinder 280 of a gas spring counter balance 278 is attached to the robot arm 255. A piston 282 extending out of the cylinder 280 is attached to the lift unit 252. The gas spring counterbalance 278 exerts a constant upward force on the robot arm 255, to reduce the lifting or braking force that the lift motor 257 must exert to move or position the robot arm 255.

Referring still to FIGS. 17–23, the robot arm 255 has an elbow drive A/C motor 259 within an elbow housing 258. The elbow housing 258 is attached to the slide of the lift rail 254, on the lift unit 252. A forearm 260 is attached to the elbow housing 258 via an elbow joint 256. The forearm 260 is mechanically coupled to the elbow drive motor 259 via a gear reduction 261.

A wrist drive A/C servo motor 265 is contained within a wrist housing 264 pivotably attached to the outer end of the forearm 260 via a wrist joint 262. A wafer holder 268 formed by opposing end effectors 270 is joined to the lower front area of the wrist housing 264. Grooves 274 in the end effectors 270 facilitate engaging, lifting and carrying the wafers 90. A remote camera head 266 positioned on top of the wrist housing 264, and linked to the computer/controller 85, views the positions of the rotor retainers within the process chambers (as described in U.S. patent application Ser. No. 08/623,349, incorporated herein by reference). The computer/controller can then determine whether the process robot can properly insert the wafers into the process chamber. The camera head 266 is also used to verify that the rotor retainers are fully locked before processing begins within the process chamber.

Motor amplifiers 275, for driving the wrist drive motor 265, elbow drive motor 259, lift motor 257, and lateral drive motor 251, are contained in and move with the lift unit 252. Locating the motor amplifiers in the lift unit 252 reduces space requirements and cabling requirements.

THE PROCESS MODULE

Turning now to FIG. 25, a process module 300 in the process bay 95 includes, for example, the spin rinser dryer 70 and the chemical process chamber 68, although other modules, or additional modules may be used. End effector rinser dryers 302 are provided in the front floor 305 of the process module 300.

Referring to FIGS. 26–29, the process module 300 includes a process vessel 310 which partially encloses a process bowl 314. The process vessel 310 mates with a movable door 512 which can be moved between the closed position shown in solid lines in FIG. 26, and an open position shown in phantom outline.

Figure 26:
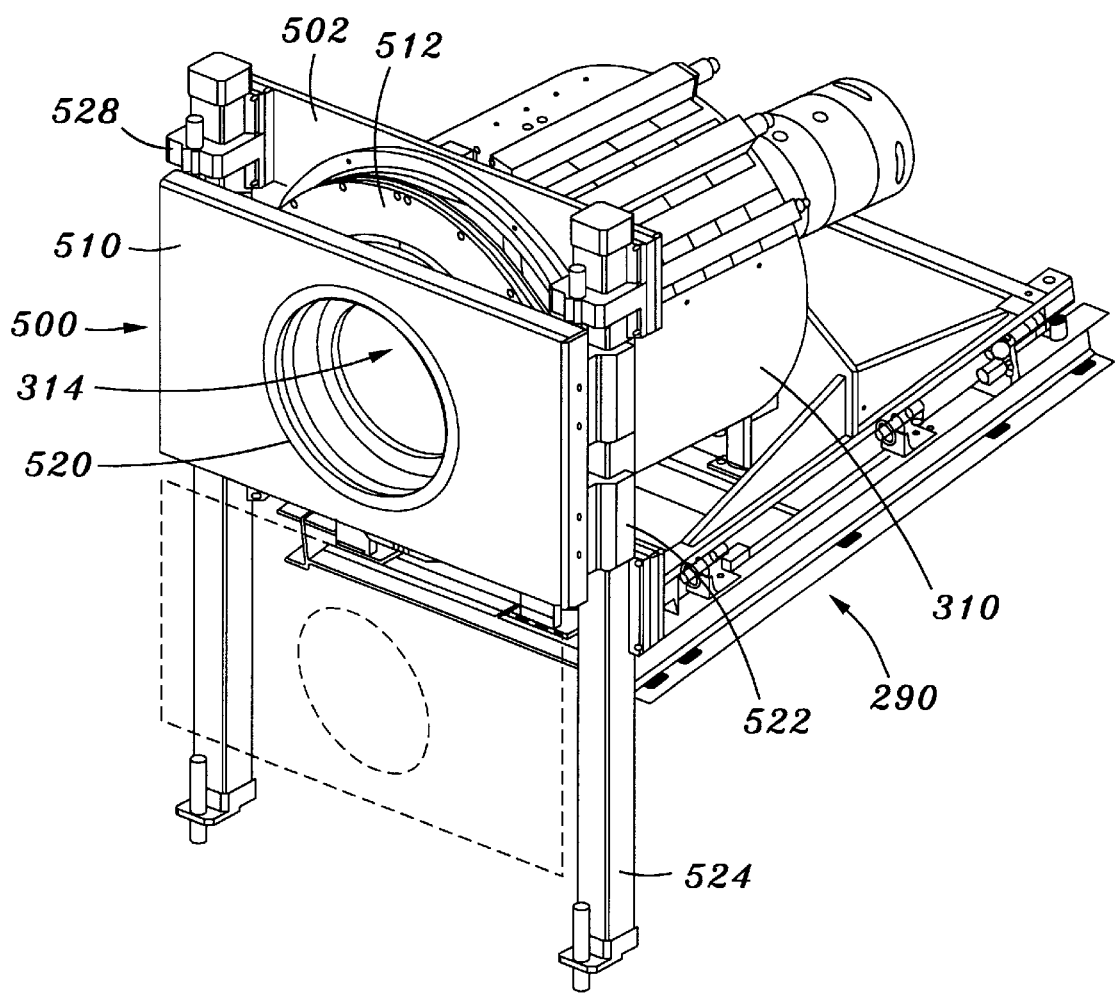
FIG. 26 is a perspective view of the semiconductor process module illustrated in FIGS. 4, 5 and 25, and having a novel door actuation and sealing mechanism.
Figure 27:
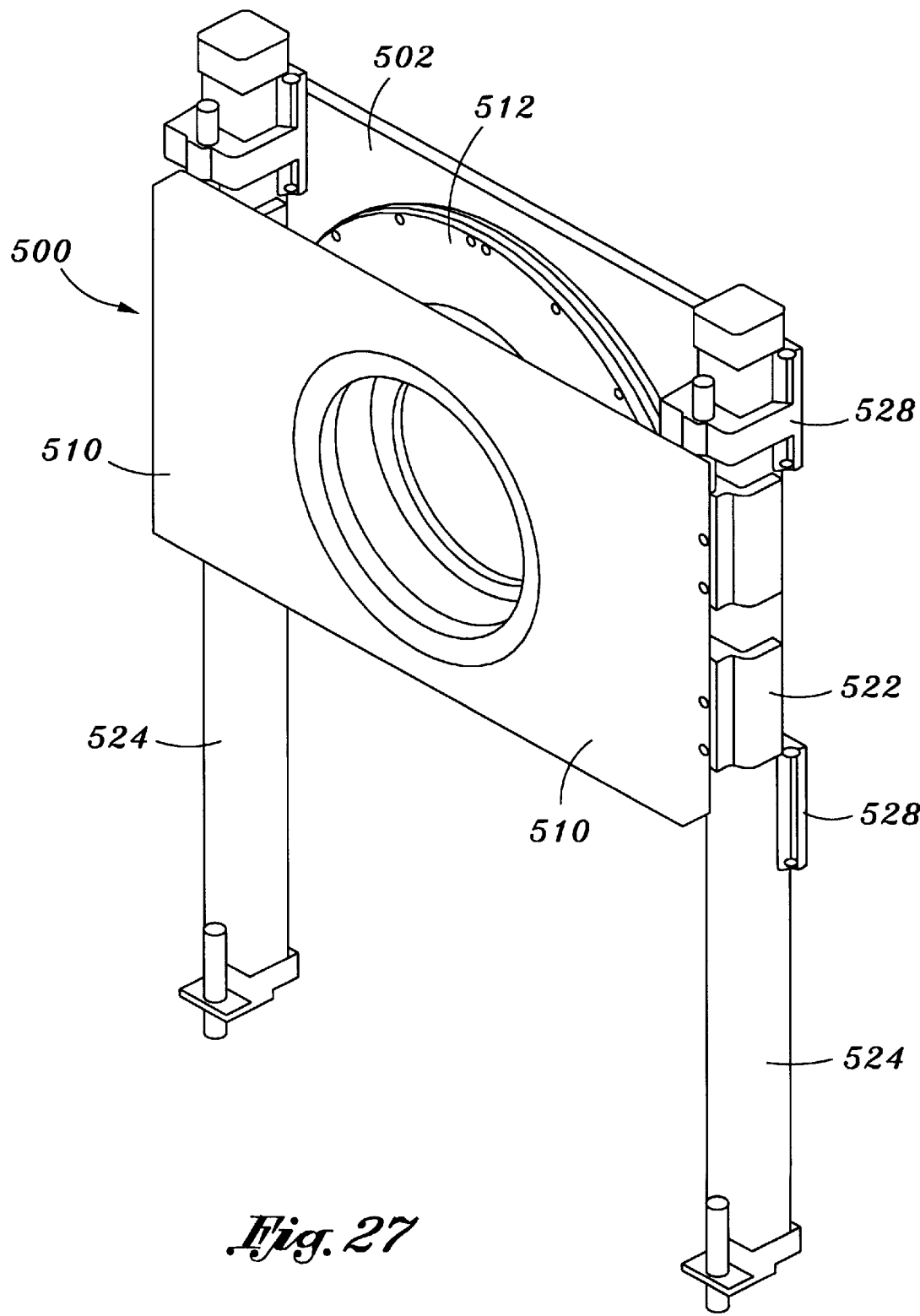
FIG. 27 is a perspective view of the process module door actuation assembly.

Referring to FIGS. 26 and 27, the door assembly 500 is aligned in a fixed position parallel to a front wall 502 of the process vessel 310.

The door assembly 500 includes a door plate 510 supporting a door 512 and a door actuator 514 generally designated 514. The door 512 includes a stiffening plate 504 having a viewing window 508 that permits visual inspection of the processing bowl or chamber 314. The door actuator 514 includes a stationary outer cylinder 516 coupled to the door support plate 510, and an extension ring 518. The extension ring 518 is concentrically and slidably positioned inside of the outer cylinder ring 516. The door support plate 510 includes a viewing aperture 520, which aligns with the window 508, when closed, for providing visibility into the processing chamber.

Referring to FIGS. 26 and 27, the door support plate 510 is attached on each side to slideable guide brackets 522. Each guide bracket 522 is slidably mounted to a pneumatic cylinder 524. The cylinders 524 are connected to the front wall 502 of the processing vessel via mounting plates 528. The combination of the guide brackets 522, the cylinders 524, and the mounting plates 528 provides a rigid door mounting construction that needs no additional guides or support blocks. The guide brackets 522 are mounted for substantially vertical movement so that the door assembly can be moved between an open position to allow access into the bowl of the processor, and a closed position wherein the door assembly is in substantially concentric alignment with the bowl 314. In the closed position, the door can be extended and sealed against the bowl 314 of the processor.

Figure 28:
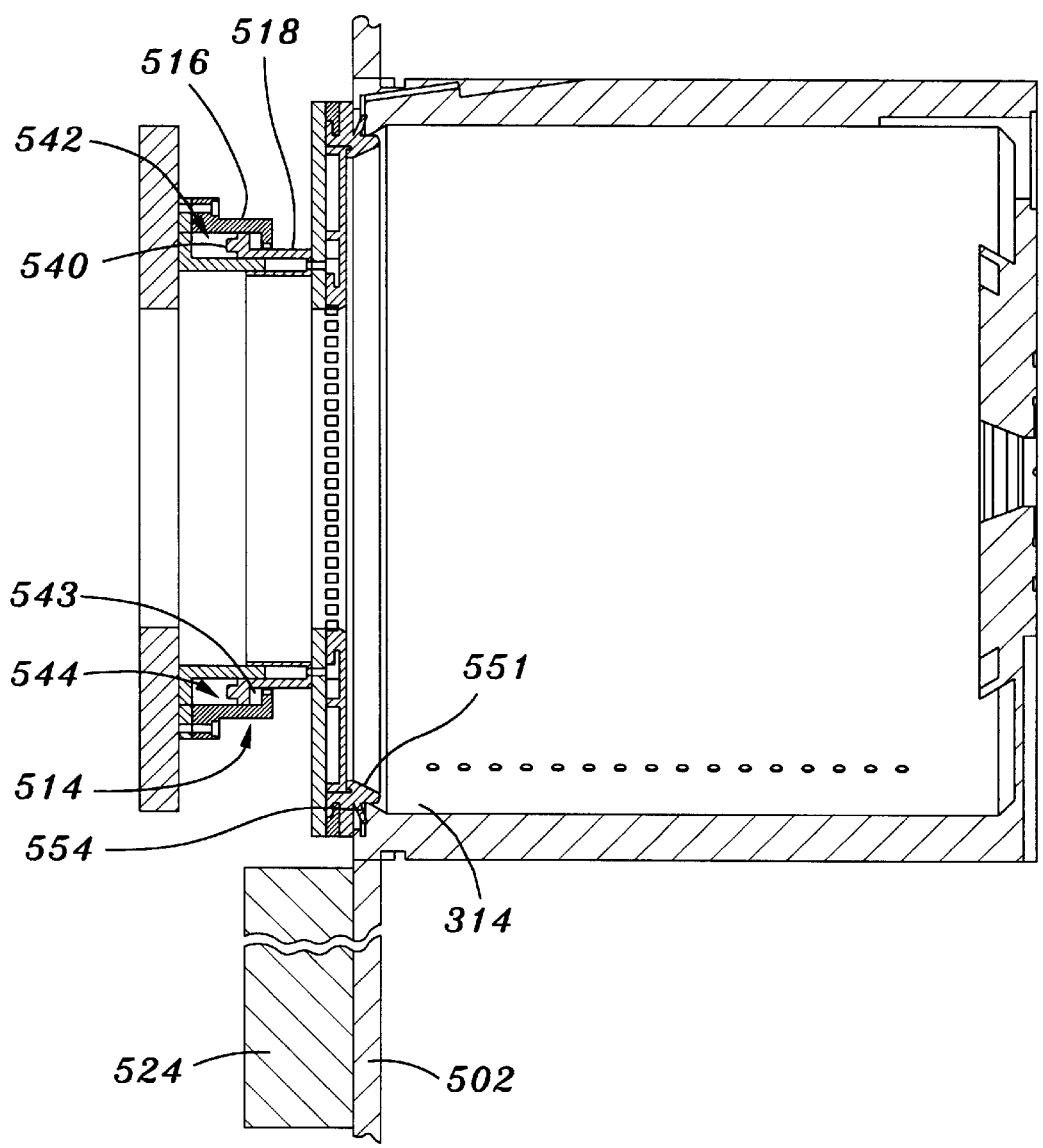
FIG. 28 is a cross-sectional side view of the process module door in an open position.
Figure 29:
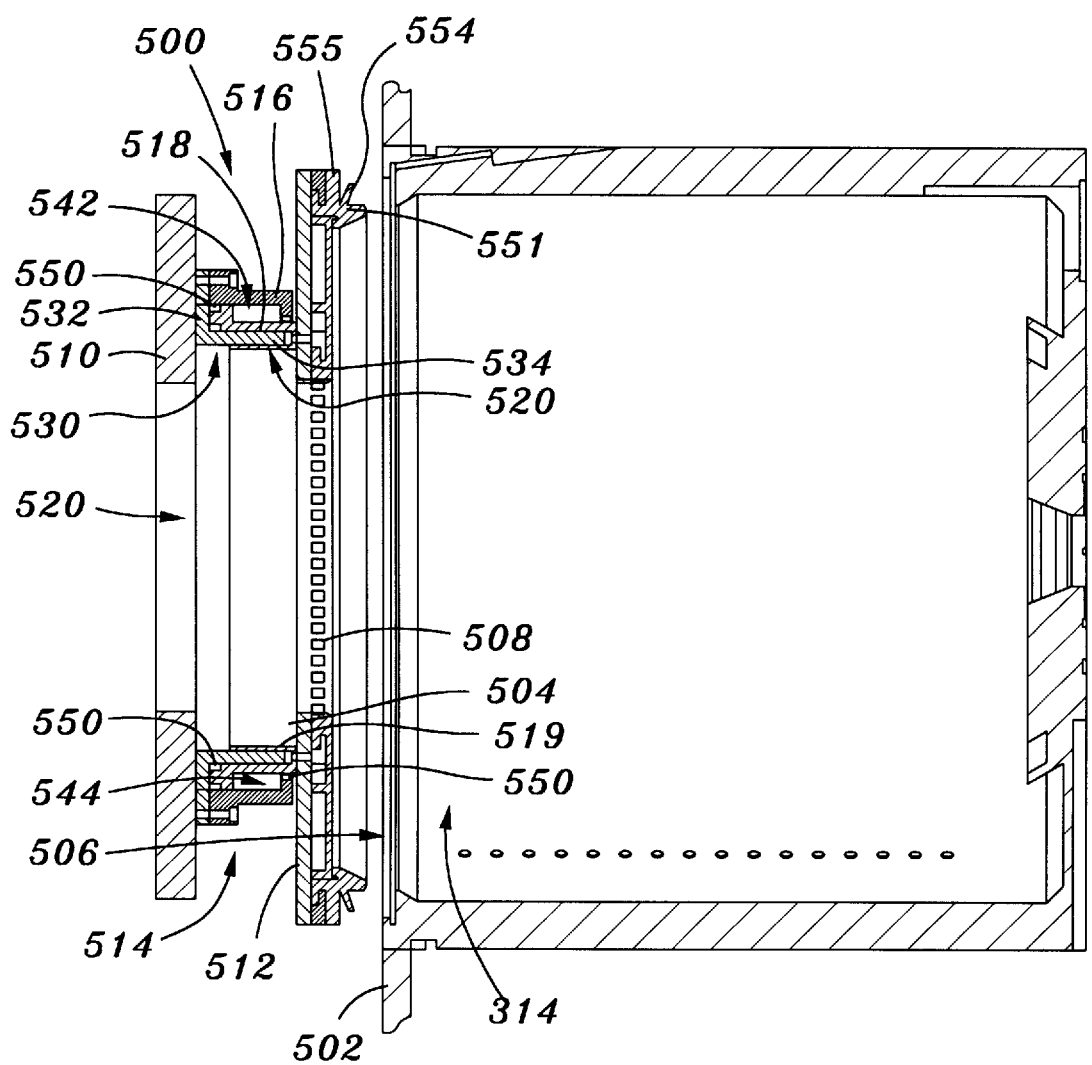
FIG. 29 is a cross-sectional side view of the process module door in a closed position.

Referring to FIGS. 28 and 29, an annular inner hub 530 has an annular flange 532 and a cylinder 534. The annular flange 532 is attached to the door support plate 510. A plurality of fasteners secure the outer cylinder ring 516 and the annular flange 532 concentrically to the mounting plate 510.

The extension ring 518 is concentrically positioned between the hub 530 and the outer cylinder ring 516, and includes a U-shaped portion 519 that defines an annular guide receptacle 520. The cylinder 534 fits within the annular guide receptacle 520. The extension ring 518 also includes an annular end face 540, as shown in FIG. 28. The extension ring 518 is displaceable with an annular chamber 542 defined by the cylinder 534 and the other cylinder ring 516, to seal and unseal the bowl 314.

The extension ring 518 bifurcates the chamber 542 into two operative compartments: a retraction chamber 543 and an extension chamber 544. Each chamber is adapted to hold pneumatic or hydraulic fluid and act as pneumatic or hydraulic cylinder. Multiple annular seals 550 are positioned on or against the extension ring 518 to seal the chambers 543 and 544.

Separate fluid supply conduits are preferably provided to the retraction chamber 543 and the extension chamber 544 to increase or decrease fluid pressure within the respective chambers and effectuate movement of the extension ring 518. As shown in FIG. 28, when hydraulic fluid is supplied to the extension chamber 544, the extension ring 518 moves away from the door support plate 510. Movement of the extension ring 518 into the extended position shown in FIG. 28 moves the door 512 into sealing engagement with the access opening 506 of the processor bowl, thereby sealing the process module 300.

An annular door seal 551 is mounted on the periphery of the door 512. The door seal includes a lip 552 and a tongue 554. When the door is in the closed position shown in FIG. 28, the lip 552 of the door seal lies in a plane that is within the front wall of the processor, and the tongue presses in sealing engagement against the outside rim of the process bowl 314 thereby making a seal between the door 512 and the process bowl 314. The door seal also preferably includes a flange 555 which acts as a stop for the door seal.

The combination of the extension ring 518 and the door seal 550 provides a highly reliable and effective door closing and sealing mechanism. Piston-like movement of the ring 518 allows it to move the door 512 straight outwardly from the support plate without bowing or bending, and without the need for peripheral adjustments to ensure smooth movement. By seating against the outside rim of the process bowl, the tongue provides an effective fluid tight seal and automatically compensates for any misalignment between the door and the processor.

The inner hub 530 and the outer cylinder ring 516, are rigidly attached to the door plate 510. The door plate, in turn, is fixed relative to the process bowl 514, via the connection of the door plate 510, to the cylinders 524, to the front wall 502. Consequently, as the extension ring 518 moves outwardly away from the door plate 510, it can press tightly against and seal the bowl 514.

OPERATION

In use, the operator of the system 50 initiates a loading sequence by entering commands via the user interface 64. The window panel 62 drops down, thereby opening the loading window 60. The operator places a cassette 88 filled with wafers 90 onto the I/O plate 132. The cassette 88 may be initially placed on the I/O plate 132 by a human operator or by another robot. The cutout 133 in the I/O plate positions the cassette 88, so that it may be lifted by the I/O robot, and also allows air to flow downwardly over the wafers 90 in the cassette 88.

The fork 100 of the I/O robot 86 is initially in the same X-Y position as the I/O plate 132. The vertical fork motor or actuator 14 raises the fork 100, until the fork has engaged the side flanges 89 of the cassette 88. The I/O robot 86 then lifts the cassette 88 vertically off of the I/O plate 132, shifts laterally (in the X direction) towards the left side wall 56, via actuation of the lateral motor 108. This movement aligns the now lifted cassette with the input row of the indexer. The I/O robot 86 then moves the lifted cassette longitudinally (in the Y-direction) toward the indexer, until the cassette is aligned above a pallet in position A, via the Y-axis motor 114. The I/O robot then sets the cassette 88 down on the pallet 136 at position A on the indexer 72. If there is no pallet at position A, the indexer 72 must first be sequenced, as described below, to bring a pallet into position A. The I/O robot then returns the fork 100 to its initial position.

With a first cassette 88 resting on a pallet 136 at position A, which is the cassette loading position, the longitudinal shift system 170 moves the side forks 180B–J (in the direction of arrow O in FIG. 12) until the side fork 180B is underneath the pallet 136 and cassette 88 in position A. The end forks 146A and 146B have down or at-rest positions below the down or at-rest positions of the side forks 180B–J, so that the side forks 180B, 180E, 180G, and 180J can move into the end positions A, E, F and J, without interfering with the end forks 146A and 146B. As all of the side forks 180B–J are attached to the longitudinal drive belt 178, they all necessarily move together in the Y direction.

With the side fork 180B underneath the first cassette 88 in position A, the eight side fork air actuators or cylinders 174 are extended, causing the side forks 180 to lift the pallets above them up and off of the pallet deck 139. With the pallets in the up position, the longitudinal drive motor 176 turns in the opposite direction, moving side fork 180B, now carrying the first cassette 88 on a pallet, from position A to position B. The air cylinders 174 are then retracted to lower the pallet 136 and cassette 88 down into position B. After this movement is completed, there is no pallet at position A. As all of the side fork actuators 174 are controlled to move simultaneously, all of the side forks 180B–J necessarily move together in the vertical Z-axis direction.

To continue loading or sequencing the indexer 72, the longitudinal drive motor 176 is again energized to move side fork 180B back towards position A, and thereby move side fork 180J from position J back to position I. During this movement, the side fork air cylinders 174 are down, so that there is no pallet movement. Rather, the side forks are merely repositioned below the pallets. The side forks are moved, in this step, enough to avoid interfering with the end forks, and not necessarily one complete position. With the side fork 180) now clear of position J, the lateral drive motor 154 is energized to move the end fork 146B from position A to position J, and to simultaneously move the end fork 146A from position F to position E. Once under position J, the lateral air cylinders 152 are extended, lifting end fork 146B, and the pallet at position J, and simultaneously lifting end fork 146A to lift the pallet at position E. The lateral drive motor 154 is then energized in the reverse direction (direction L in FIG. 12) and via the lateral belt 156, the end fork 146B carries the pallet from position J to position A, and simultaneously, the end fork 146A carries a pallet from position E to position F. The lateral air cylinders 152 are then retracted, to lower the pallets into positions A and F on the indexer deck 139.

With a second pallet in position A, the indexer 72 is ready to receive a second cassette 88. After a second cassette is positioned on the I/O plate 132, the I/O robot 86 repeats the indexer loading sequence of cassette movements, so that the second cassette is placed on the indexer at position A.

The foregoing sequence of steps is repeated until a cassette is loaded onto each of the eight pallets in the indexer. As the indexer has ten positions A–J, and eight pallets, two diagonally opposite corner positions, either positions A and F, or positions E and J, will, at any given time, not have a pallet.

After the first and second cassettes 88 loaded into the indexer 72 arrive at positions I and J, the elevator 78 is energized, lifting the wafer platforms 216 on the lift columns 214 up through the open bottom of the cassettes 88. The wafers 90 in the cassettes are lifted to an elevated access position, as shown in FIG. 16, where they are now ready to be picked up by the process robot 66.

The window panel 62 moves up to close off the loading window 60, to prevent an operator from inadvertently coming into contact with moving components within the enclosure 54.

Figure 21:
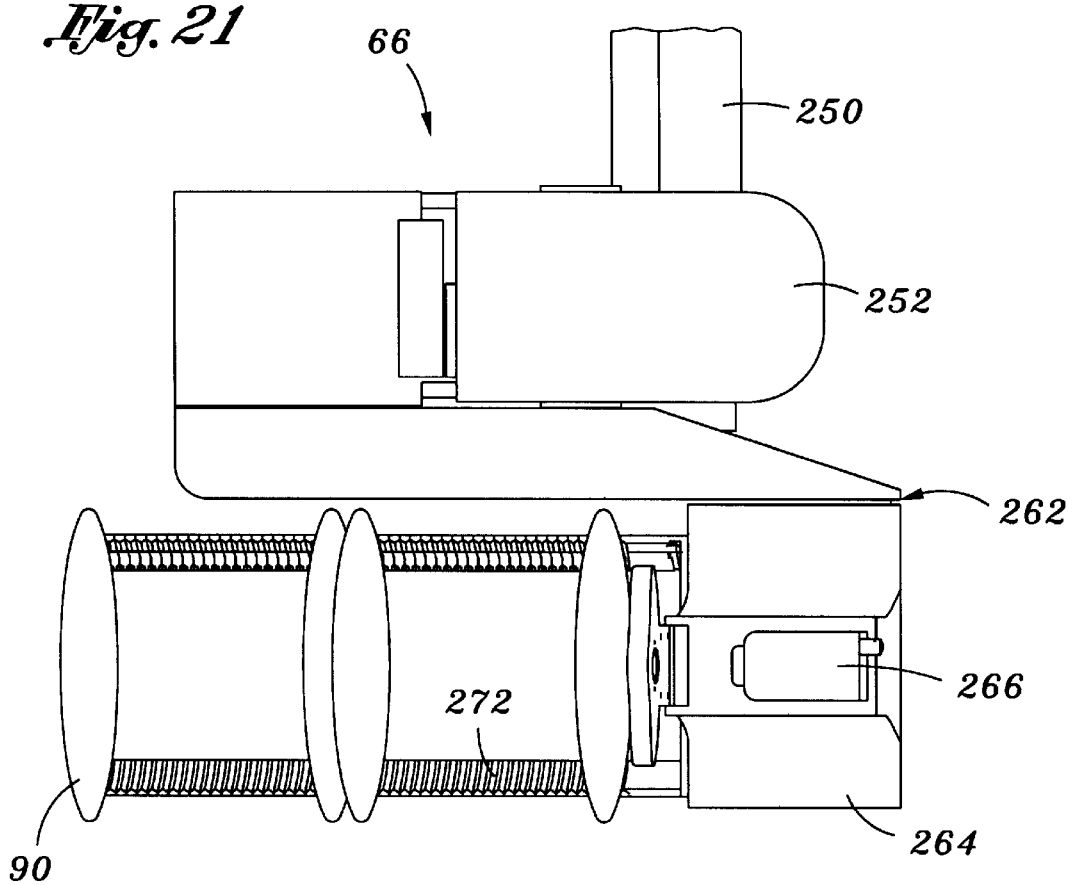
FIG. 21 is a plan view thereof.
Figure 20:
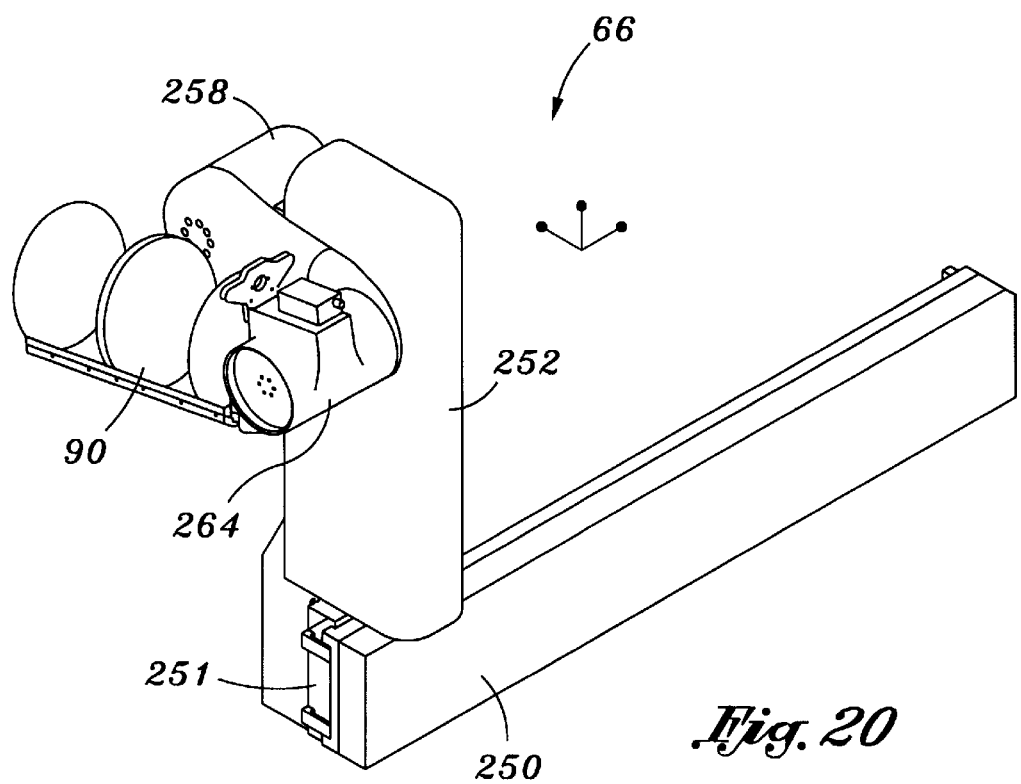
FIG. 20 is a rear perspective view of the process robot, with the arm fully withdrawn.

Referring now to FIGS. 20, 21 and 24B, the process robot 66 moves to lift the wafers 90 off of the elevator 78. Specifically, the lateral drive flux motor 251 moves the lift unit 252 laterally until the wafer holder 268 is properly aligned with the wafers 90 on the elevator 78. With appropriate control of the lift motor 257, the elbow drive motor 258, and the wrist drive motor 265, the wafer holder 268 is moved in until the end effectors 270 are positioned and aligned on either side of the wafers 90, with the grooves 274 in the end effectors 270 each aligned to receive a wafer. As shown in FIG. 24B, this wafer engagement movement is an underhanded movement of the robot arm 255. The wafer holder 268 is moved up to lift the wafers 90 off of the elevator 78. The robot arm 255 then withdraws to the position shown in FIG. 24C. As the forearm has a 370° range of movement, and robot arm 255 is offset from the lift unit, the robot arm can be fully backed away from the indexer, with only minimal clearance space required, as shown in FIGS. 20 and 21. By appropriate control of the motors in the robot arm, the wafers are maintained in a vertical or near vertical position.

Figure 22:
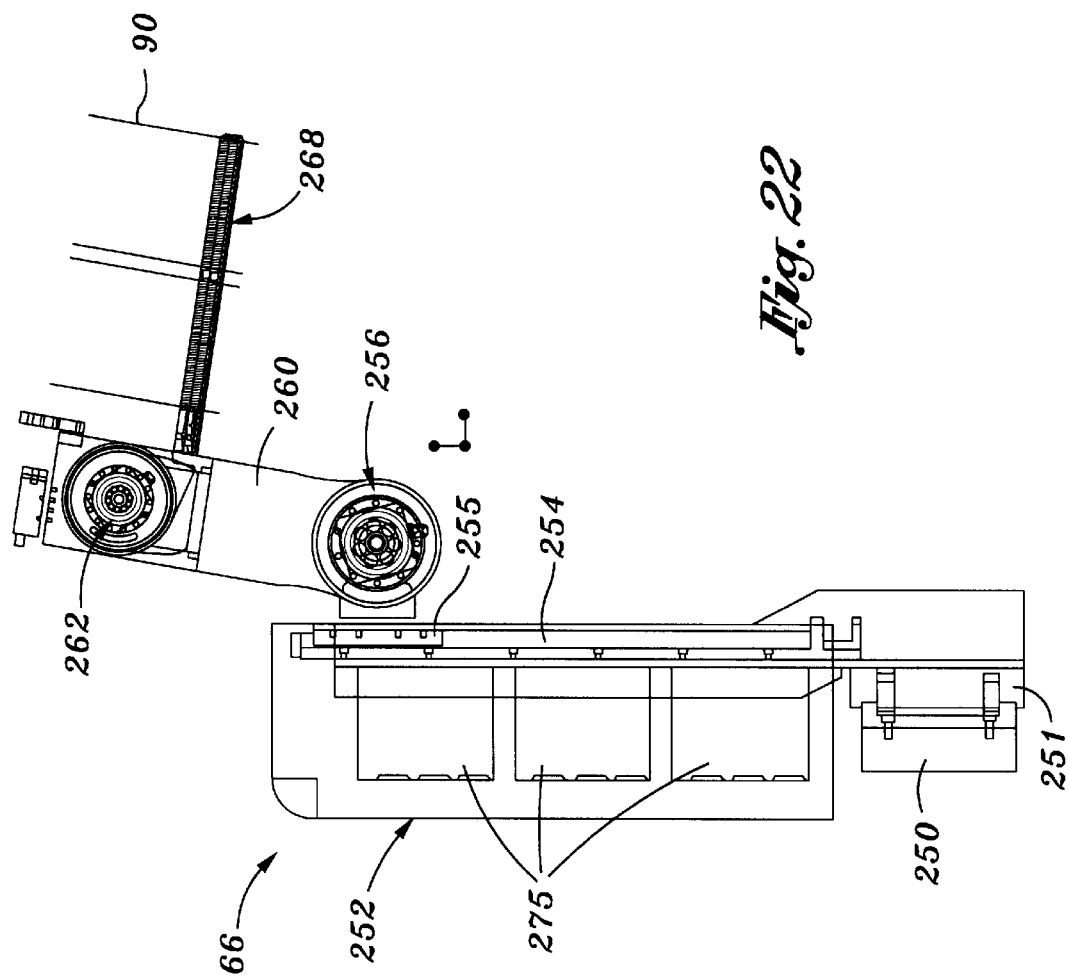
FIG. 22 is a side elevation view, in part section, of the process robot.

To deliver the wafers 90 to a process chamber, the lateral drive motor 251 is energized to move the lift unit 252 so that the wafers in the wafer holder 268 are brought into alignment with the selected process chamber. The robot arm 255 is raised up on the lift unit by the lift motor 257. In addition, the forearm 260 is pivoted upwardly via the elbow drive motor 259. Simultaneously, the wrist drive motor 265 is driven in an opposite direction to bring or maintain the wafer holder in an approximately 10° down incline orientation, as shown in FIG. 22. Using an overhand movement, as shown in FIG. 24A, the forearm is pivoted downwardly to extend the wafer holder carrying the wafers into the process chamber. The robot arm 255 then withdraws from the process chamber.

To clean the end effectors 270, the wrist drive motor 265 is controlled to orient the end effectors vertically, as shown in FIG. 24D. With the end effectors aligned with the end effector rinser/dryer 302, the lift motor 257 lowers the entire robot arm 255, to extend the end effectors into the end effector rinser/dryer 302. After the end effectors 270 are cleaned and dried, they are withdrawn from the end effector rinser/dryer 302 and positioned to remove wafers from either process chamber, or to pick up additional batches of wafers from the indexer for delivery to a process chamber. As the end effectors are cleaned at the process chamber rather than at another location, processing time can be reduced, because this cleaning step is accomplished without the need to move the process robot.

As is apparent from e.g., FIG. 23, the wafer holder 268 is offset to one side of the wrist joint 262 and elbow joint 256, as well as the other components of the process robot 66. No part of the process robot 66 is ever positioned directly above the wafers. As air is blown downwardly in the enclosure 54, any particles generated or released by the process robot 66 will not come into contact with the wafers. As a result, the potential for contamination of the wafers during processing is reduced.

Referring to FIGS. 24A–24E, the process robot 66 has an elbow joint 256 and a wrist joint 262, joined by a single segment or forearm 260. Consequently, in contrast to earlier known systems having shoulder, elbow and wrist joints, joined by two arm segments, the process robot 66 achieves a range of vertical reach via movement of the robot arm 255 on the lift rail 254, rather than by articulation of arm segments. This allows the process robot 66 to be very compact, while still achieving sufficient ranges of movement. Correspondingly, the entire enclosure 54 can be made more compact.

As the process robot 66 can perform both underhanded and overhanded movements, the vertical travel necessary on the lift rail 254 is limited. In addition, the ability to perform both underhanded and overhanded movements allows the forearm 260 to be relatively short, which also contributes to a compact enclosure 54. to Referring to FIGS. 1 and 16, the buffer shelf 76 moves forward (in direction O in FIG. 17) when the elevator 78 is in the down position, to receive up to 50 wafers. The buffer shelf 76 holds the wafers until the appropriate empty cassette 88 is moved into the I and J positions, so that the process robot 66 can move the disks from the buffer shelf 76 into the cassettes at positions I and J. When the buffer shelf 76 is not being loaded or unloaded with wafers, it remains in the back position (moved in direction I), so as not to interfere with operation of the elevator 78. The buffer shelf 76 temporarily holds already processed wafers, so that the process robot 66 can access and move the next batch of wafers for placement into the process chambers, before off loading already processed wafers back into the indexer. This ensures that the process chambers are constantly supplied with wafers for processing.

SECOND INDEXER EMBODIMENT

Figure 30:
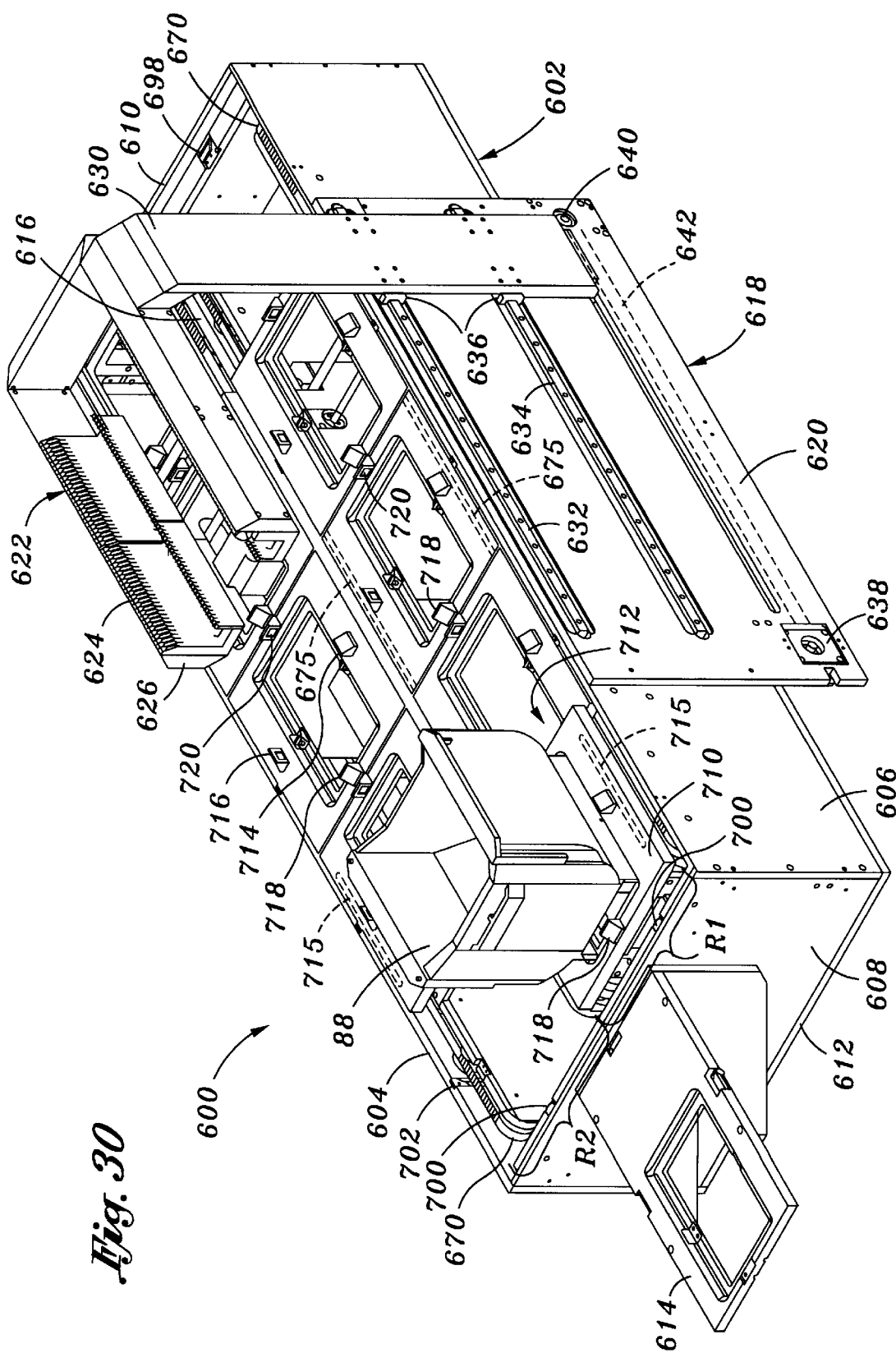
FIG. 30 is a perspective view of a second indexer embodiment.
Figure 31:
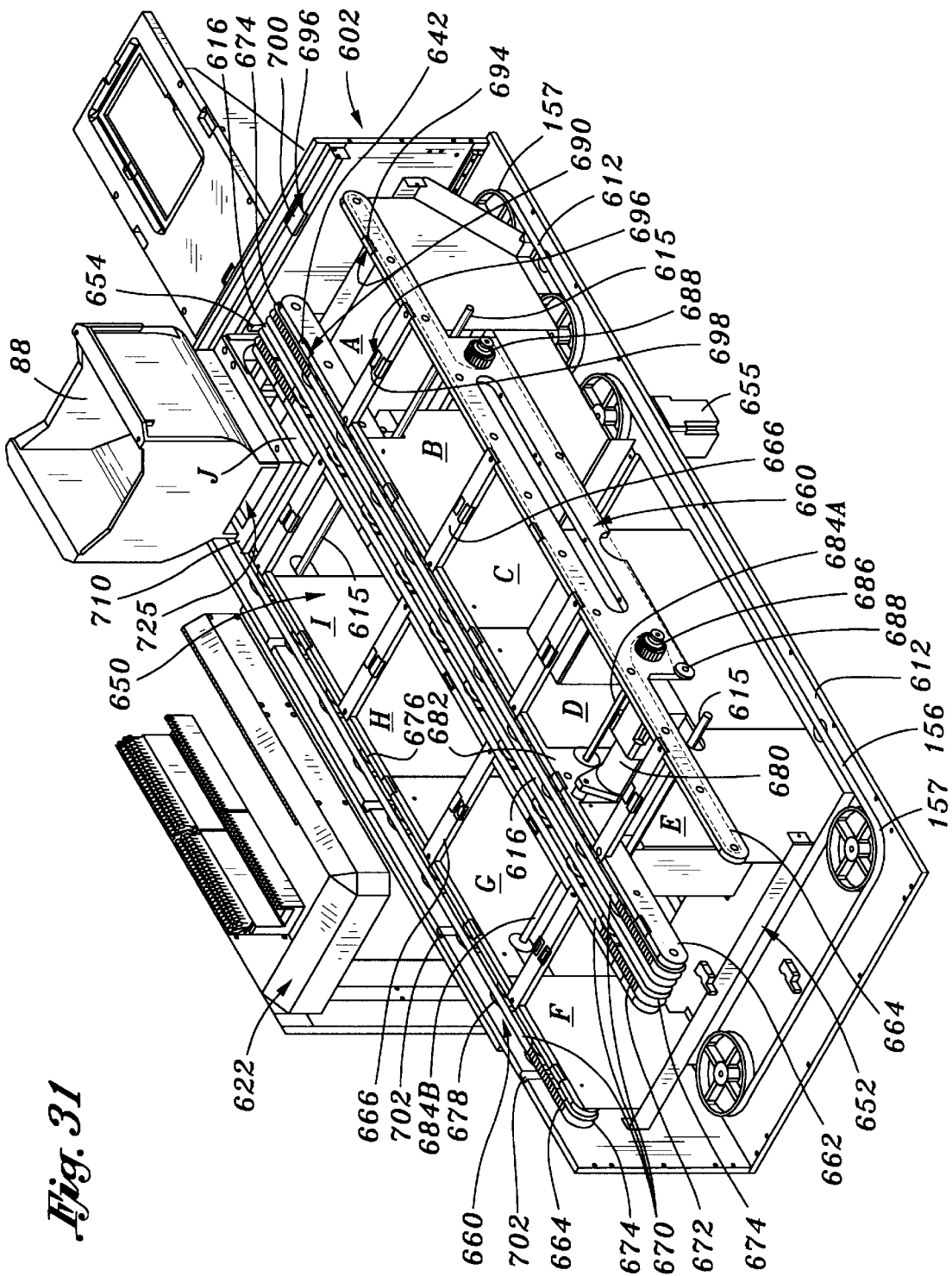
FIG. 31 is a reversed perspective view of the indexer shown in FIG. 30, with various components removed, for purposes of illustration.

As shown in FIGS. 30 and 31, a second embodiment indexer 600 includes a box frame 602 formed by side walls 604 and 606, a front end wall 608, and a back end wall 610, joined to each other, and to a base plate 612. An input plate 614 extends outwardly from the front end wall 608. A center wall 616 and lateral ribs 666, divide the indexer 600 into first and second rows R1 and R2, with each row having 5 pallet positions or stations, i.e., A–E and F–J, as shown in FIG. 12. The center wall 616 is supported in the box frame 602 via support bars 615 extending from the center wall 616 to the side walls 604 and 606.

Referring to FIG. 30, a buffer assembly 618 includes a buffer side plate 620 attached to the inner side wall 606. A buffer tray 622 has combs 624 on comb arms 626. The buffer tray 622 is supported on a buffer tray support 630. The tray support 630 in turn is slidably mounted on upper and lower buffer rails 632 and 634, on the buffer side plate 620. Linear bearings 636 on the tray support 630 allow for low friction movement of the tray support 630 along the rails 632 and 634.

A buffer drive belt 642 extends around a buffer drive motor 638 and an end pulley 640. The buffer drive belt 642 is attached to the buffer tray support, so that rotational movement of the motor 638 causes translational (y-axis) movement of the buffer tray support 630 along the rails 632 and 634. Locating the buffer assembly 618 on the side of the indexer 600, as shown in FIG. 30, allows for a more compact design, in comparison to the centrally located buffer assembly of the first indexer embodiment 72 shown in FIG. 8.

Referring to FIGS. 30 and 31, the indexer 600 includes a longitudinal or y-axis shift assembly, generally designated 650, and a lateral or x-axis shift assembly, generally designated as 652.

Referring to FIG. 31, the y-axis shift assembly 650 includes 2 side by side and parallel y-axis frames 660. Each y-axis frame 660 includes an inner frame plate 662, adjacent and attached to the center wall 616, and an outer frame plate 664, supported on the side walls 604 and 606. The lateral ribs 666 are attached to and extend between the inner frame plate 662 and outer frame plate 664, in both of the y-axis frames 660.

End rollers 674 are rotatably mounted at the ends of each of the inner and outer frame plates 662 and 664 (for a total of 8 end rollers 674). Idler rollers 676 are spaced apart and rotatably mounted on the frame plates 662 and 664, between the end rollers 674, on each frame plate 662 and 664. An endless toothed belt 670 is mounted over the end rollers 674 and idler rollers 676 on each frame plate 662 and 664 (for a total of 4 endless toothed belts 670). The teeth 672 on the belts 670 face outwardly, so that the smooth inside or back surface of the belts 670 contact the end rollers 674 and idler rollers 676. While for illustration purposes, the teeth 672 are shown only at sections of the belts 670, the belts 670 actually have continuous teeth 672 all around. In addition, for illustration purposes, the rollers and belt in the foreground of FIG. 31 have been omitted from the drawing.

Referring still to FIG. 31, a y-axis drive motor 680 supported on the center wall 616 is linked or engaged to a gear unit 682, which turns drive shafts 684A and 684B (in the side by side parallel y-axis frames 660) at equal speeds, but in opposite directions. The drive shafts 684A and 684B turn drive sprockets 686, which in turn drive the belts 670. The outside toothed surface of the belts 670 wraps around the drive sprockets 686, and around an idler sprockets 688, as shown in dotted line in FIG. 31.

As shown in FIG. 31, an x-axis sensor pair 690, and a y-axis sensor pair 696, is provided at each of the ten pallet stations or locations A–J, delineated by the lateral ribs 666. The x-axis sensor pair includes an infrared transmitter 692 and an infrared detector 694, laterally aligned with each other (on a line perpendicular to the frame plates 662 and 664). Similarly, the y-axis sensor pair 696 includes a y-axis infrared transmitter 698 and a y-axis infrared detector 700, located generally centrally on the lateral ribs 666, and aligned with each other (on a line parallel to the frame plates 662 and 664).

A reflective optical sensor 702 is provided in the side walls 604 and 606, at each of the pallet positions A–J. The sensor pairs 690 and 696 and optical sensor 702 are linked to the controller 85, which monitors and controls operations of the indexer 600.

Referring back to FIG. 30, 8 rectangular pallets 710 are provided in each row R1 and R2 of the indexer 600, so that four of the pallet positions in each row are always occupied by a pallet 710, and one end position adjacent to end wall 608 or 610 is always open. Each pallet 710 has a rectangular pallet cutout or opening 712. Pallet tooth racks 715, shown in dotted line in FIG. 30, are provided on the bottom surface of the pallets 710. The tooth rack 715 extends along both of the longer sides of the pallet 710. The tooth rack 715 has teeth matching the size and pitch of the teeth 672 on the belts 70. Consequently, when a pallet 710 is placed on a y-axis frame 660, the teeth on the pallet tooth rack 715 positively engage the teeth 672 on the belts 670, so that the pallet is substantially locked against y-axis movement relative to the belts 670.

Each pallet 710 has a pair of x-axis and y-axis prisms. Specifically, an x-axis transmitter prism 714 is longitudinally aligned with an x-axis detector prism 716, on each pallet 710, as shown in FIG. 30. Similarly, a y-axis transmitter prism 718 is laterally aligned with a y-axis detector prism 720, on each pallet 710. With the pallet 710 in any one of the ten pallet positions A–J in the indexer 600, the x-axis transmitter prism 714 and x-axis detector prism 716 are vertically directly above or aligned with the x-axis infrared transmitter 692 and x-axis infrared detector 694, respectively, in that pallet position. Similarly, the y-axis transmitter prism 718 and y-axis detector prism 720 are vertically directly above and aligned with the y-axis infrared transmitter 698 and the y-axis infrared detector 700, in that pallet position.

Referring to FIG. 31, the idler rollers 676 have roller flanges 678 which protrude vertically above the belts 670. The roller flanges 678 fit into roller grooves 675 (shown in dotted line in FIG. 30) on the bottom surface of each pallet 710. The engagement of the roller flanges 678 into the grooves 675 prevents any x-axis movement of the pallets 710 (unless the pallet 710 is lifted vertically.) Accordingly, the pallets 710 are vertically supported on both the belts 670 and roller flanges 678.

The indexer 600 has an x-axis shift assembly 652 substantially the same as the x-axis shift assembly or shift system 140 shown in FIGS. 9 and 10 and described above, and is therefore not further described or illustrated here. However, rather than the end fork air cylinder 152 used in the x-axis shift system 140, the x-axis shift assembly 652 in the indexer 600 has a pallet lift electric motor 654, for better control of pallet lift movement.

The operation and sequencing of the indexer 600 is similar to that of the indexer 72 described above with reference to FIGS. 8–12. However, pallet movement along the y-axis is achieved via the computer controller 85 controlling the y-axis drive motor 680 to incrementally move, or index, the belts 670. During movement in the y-axis, the pallets 710 remain on the belts 670 and rollers 676. As a result, unlike the indexer 72, in the indexer 600, shown in FIGS. 30 and 31, there is no vertical movement of pallets 710, as the pallets move in the y-axis direction, between pallet stations.

X-axis movement of the pallets 710 at the ends of the indexer 600, is similar to the movement described above for the indexer 72 and is therefore not further described here.

At each pallet position, the optical sensor 72 detects the presence or absence of a pallet 710 via detecting the presence or absence of reflected light. In addition, at each pallet position A–J, the x-axis sensor pair 690 detects the presence or absence of a cassette 88. Specifically, the infrared transmitter 692 projects a light beam vertically upwardly. The light beam passes through the x-axis transmitter prism 714, on each pallet 710, which bends the light beam 90°, so that the light beam is then projected horizontally inwardly towards the x-axis detector prism 716. If a cassette 88 is present on the pallet 710, the light beam will be blocked by the cassette 88, and the x-axis detector 694 will not detect any infrared light, indicating presence of a cassette 88. On the other hand, if the pallet 710 has no cassette 88 on it, infrared light from the transmitter 692 passes through the x-axis transmitter prism 714, passes over the pallet 710, and is redirected downwardly by the x-axis detector prism 716, so that the infrared light is directed to and detected by the x-axis infrared detector 694, indicating the absence of a cassette 88.

The y-axis sensor pair 696 works in a similar way, to detect the presence or absence of wafers in the cassette 88. With a cassette 88 on a pallet 710, infrared light from the yaxis transmitter 698 is projected vertically upwardly, and is turned 90° by the y-axis transmitter prism 718, so that the light projects through a slot or tunnel 725 at the bottom of the cassette 88. If no wafers or other flat media are present in the cassette 88, the light travels entirely through the tunnel 75, is redirected downwardly by the y-axis detector prism 720, and is detected by the y-axis detector 700, indicating absence of any wafers in the cassette 88. If a wafer is in the cassette 88, the bottom edge of the wafer projects downwardly through the tunnel 725, preventing light from passing through the tunnel. Accordingly, the presence of any wafer in the cassette 88 will block the light from the y-axis transmitter 698, so that the y-axis detector 700 detects no light, indicating presence of at least one wafer in the cassette 88.

Operation of the buffer assembly 618 in the indexer 600 is similar to operation of the buffer assembly 76, described above, and shown in FIG. 8. However, locating the buffer assembly 618 at the side of the indexer 600 allows for a more compact design. Use of the belts 670 provides for faster and more reliable pallet movement, in contrast to the indexer 72 shown in FIGS. 8–16. Use of the prisms 714–720 allows for detection of cassettes and wafers, without requiring lifting of the pallets.

Thus, a novel automated semiconductor processing system has been shown and described. Various changes can of course be made without departing from the sprit and scope of the invention. The invention, therefore, should not be limited, except by the following claims and their equivalents.

What is claimed is:

1. A machine for processing flat media articles, comprising:
   an enclosure;
   an indexer within the enclosure, the indexer comprising:
      an x-axis shift assembly; and
      a y-axis shift assembly including first and second pairs of belts having a plurality of teeth;
      a motor linked at least indirectly to the first and second pairs of belts, for driving the first and second pairs of belts simultaneously in opposite directions; and
      a plurality of pallets supported at least partially on the belts with a plurality of teeth projecting from a bottom surface of each pallet, for engaging the teeth on the first and second pair of belts.

2. The machine of claim 1 further comprising a plurality of spaced apart rollers supporting the first and second pairs of belts, the rollers having flanges extending upwardly above the belts, and with the pallets supported at least partially on the flanges of the rollers.

3. The machine of claim 2 with the roller flanges extending into grooves in the pallets, to restrict pallet movement perpendicular to the belts.

4. The machine of claim 1 wherein each of the belts extends continuously through a plurality of indexer stations, and wherein the pallets are movable on the belts between indexer stations without lifting the pallets off of the belts.

5. The machine of claim 1 further comprising a buffer assembly attached to one side of the indexer, and a buffer drive motor linked to the buffer assembly, for moving the buffer assembly in a horizontal direction parallel to the belts of the y-axis shift assembly.

6. The machine of claim 5 wherein the buffer assembly comprises a buffer plate attached to the indexer, a buffer slide rail attached to the buffer plate, and a buffer tray slidably supported on the buffer guide rails.

7. The machine of claim 1 further comprising a pair of prisms on at least one of the pallets.

8. The machine of claim 1 further comprising a first station in the indexer under the first pair of belts, a first sensor pair in the first station, and a first prism pair on at least one of the pallets.

9. The machine of claim 8 further comprising a pallet sensor in the first station, for detecting the presence of a pallet at the first station.

10. The machine of claim 9 further comprising a second sensor pair in the first station, and a second prism pair on the at least one pallet, with the second prism pair oriented on a second line and the first prism pair oriented on a first line, with the second line perpendicular to the first line.

11. The machine of claim 1 further comprising a pallet lifter in the x-axis shift assembly for lifting a pallet up off of the first pair of belts and for lowering the pallet onto the second pair of belts.

12. The system of claim 1 where the belts are endless toothed belts, with the teeth on the first and second pairs of endless toothed belts facing outwardly.

13. The system of claim 12 with each pallet including a toothed rack on a bottom surface for engaging the teeth on the first and second pairs of endless toothed belts.

14. A machine for processing flat media, comprising:
an enclosure;
at least one process chamber within the enclosure;
an indexer frame within the enclosure;
at least one toothed belt within the indexer frame;
a motor linked to the at least one toothed belt;
a pallet supported at least partially on the toothed belt, the pallet having a toothed rack meshed with the at least one toothed belt, and with the pallet having an opening through it;
an elevator for raising and lowering a platform through the opening of the pallet; and
a process robot within the enclosure for carrying flat media between the indexer frame and the at least one process chamber.

15. A machine for processing flat media, comprising:
an indexer;
a y-axis shift system in the indexer;
a plurality of pallets supported on the y-axis shift system;
a first prism pair on at least one of the pallets; and
a first sensor pair aligned with the first prism pair.

16. A machine for storing and handling flat media held in cassettes supported on pallets, comprising:
a first-axis shift system for moving the pallets in a first direction;
a second-axis shift system for moving the pallets in a second direction perpendicular to the first direction;
a plurality of pallet stations aligned with at least one of the first-axis and the second-axis shift systems;
a pallet sensor at substantially each of the pallet stations;
a cassette sensor at substantially each pallet station;
a flat media sensor at substantially each pallet station;
a pair of cassette sensor prisms on substantially each pallet; and
a pair of flat media sensor prisms on substantially each pallet.

17. A method of handling flat media comprising the steps of:

placing a cassette holding flat media onto a pallet;
placing the pallet onto a specific location on a first belt in an indexer;
indexing the first belt and incrementally moving the pallet in a first direction from a first pallet station to a second pallet station within the indexer, with the pallet continuously remaining on the first belt;
lifting the pallet vertically off of the first belt;
moving the pallet in a direction perpendicular to the first direction, into a position over a second belt;
lowering the pallet onto a specific location on a second belt; and
indexing the second belt and incrementally moving the pallet in a second direction, opposite to the first direction, with the pallet continuously remaining on the second belt.

18. The method of claim 17 where the pallet is raised and lowered by substantially equivalent distances.

19. A flat media processing system comprising:
an enclosure;
at least one process chamber within the enclosure;
an indexer within the enclosure, the indexer comprising:
an x-axis shift assembly;
a y-axis shift assembly including a first pair and a second pair of belts;
a motor linked at least indirectly to the first and second pairs of belts for driving the first and second pairs of belts simultaneously in opposite directions;
a plurality of pallets supported at least partially on the first and second pairs of belts; and
a process robot within the enclosure for carrying the semiconductor articles between the indexer and the at least one process chamber.

20. A flat media processing system comprising:
an enclosure;
at least one process chamber within the enclosure;
an indexer within the enclosure; and
a transfer robot for moving flat media from the indexer to the at least one process chamber;
the indexer comprising:
a y-axis shift assembly including first and second pairs of belts;
a motor linked at least indirectly to the first and second pairs of belts for driving the first and second pairs of belts in opposite y-axis directions;
a plurality of pallets supported at least partially on the first and second pairs of belts;
an x-axis shift assembly including first and second pallet lifters, for lifting pallets up and off the first and second pairs of belts, respectively; and
a lateral drive motor linked at least indirectly to the first and second pallet lifters for driving the first and second pallet lifters in directions perpendicular to the y-axis.

21. a The semiconductor article processing system of claim 20, wherein the first and second pairs of belts are endless toothed belts, the teeth on the first and second pairs of endless toothed belts facing outward, with each pallet including a toothed rack on a bottom surface for engaging the teeth on the first and second pairs of endless toothed belts.

22. The processing system of claim 20, wherein the first and second pallet lifters move simultaneously in opposite directions.

23. A machine for processing flat media comprising:
- a first shift assembly in the indexer for indexing pallets in a first direction;
- a second shift assembly in the indexer for indexing pallets in a second direction, perpendicular to the first direction;
- a plurality of pallets supported on and indexable by the first shift assembly;
- a first transmitter and first detector attached to the indexer, and a first transmitter prism and a first detector prism on at least one of the pallets and aligned with each other in the second direction, the first transmitter prism on the pallet optically aligned with the first transmitter and the first detector prism on the pallet optically aligned with the first detector, wherein the pallet containing the first transmitter prism and the first detector prism is detected by the first transmitter and first detector, when the first transmitter prism and first detector prism are aligned with the first transmitter and first detector.

24. The first machine of claim 23 wherein the first transmitter, first detector, first transmitter prism, and first detector prism detect the presence or absence of a flat media article contained within a cassette on the pallet.

25. The machine of claim 23 further including a pallet sensor for detecting the presence or absence of a pallet at a pallet position on the indexer.

* * * * *